United States Patent
Bernal Castillo et al.

(10) Patent No.: US 11,348,567 B2
(45) Date of Patent: May 31, 2022

(54) FEEDBACK CONTROL FOR DISPLAY AS SOUND EMITTER

(71) Applicant: QUALCOMM Incorporated, San Diego, CA (US)

(72) Inventors: Ricardo De Jesus Bernal Castillo, San Diego, CA (US); Wade Heimbigner, Vista, CA (US); Dinesh Ramakrishnan, San Diego, CA (US); Andre Schevciw, San Diego, CA (US); Sang-Uk Ryu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/796,484

(22) Filed: Feb. 20, 2020

(65) Prior Publication Data

US 2020/0275221 A1 Aug. 27, 2020

Related U.S. Application Data

(60) Provisional application No. 62/893,553, filed on Aug. 29, 2019, provisional application No. 62/893,583, (Continued)

(51) Int. Cl.
*H04R 7/04* (2006.01)
*G10K 11/178* (2006.01)
(Continued)

(52) U.S. Cl.
CPC ........ *G10K 11/17883* (2018.01); *G10L 19/00* (2013.01); *H03G 5/16* (2013.01);
(Continued)

(58) Field of Classification Search
CPC . H04R 3/02; H04R 7/04; H04R 7/045; H04R 29/001; H04R 2499/11;
(Continued)

(56) References Cited

U.S. PATENT DOCUMENTS 8,538,008 B2 9/2013 Suppappola
10,200,772 B2 2/2019 Ahn et al.
(Continued)

FOREIGN PATENT DOCUMENTS

EP 2208364 B1 10/2011
EP 3226069 A2 10/2017
WO WO-2013171512 A2 11/2013

OTHER PUBLICATIONS

International Search Report and Written Opinion—PCT/US2020/019188—ISA/EPO—dated May 15, 2020.
(Continued)

*Primary Examiner* — Kile O Blair
(74) *Attorney, Agent, or Firm* — QUALCOMM Incorporated

(57) ABSTRACT

Aspects of the disclosure relate to using a display as a sound emitter and may relate to an electronic device including a display. In particular a vibration sensor such as an accelerometer is physically coupled to the display and senses display vibration to provide a high accuracy feedback loop with respect to representing actual audio output from the display. The electronic device includes an actuator physically coupled to the display and configured to cause vibration of the display in response to an audio signal. The electronic device further includes a vibration sensor physically coupled to the display and configured to output a vibration sensor signal proportional to the vibration of the display due to the actuator.

28 Claims, 20 Drawing Sheets

Related U.S. Application Data filed on Aug. 29, 2019, provisional application No. 62/810,148, filed on Feb. 25, 2019.

(51) Int. Cl.
  *H04R 1/02* (2006.01)
  *H04R 3/04* (2006.01)
  *H03G 5/16* (2006.01)
  *G10L 19/00* (2013.01)
  *H04R 1/04* (2006.01)
  *H04R 29/00* (2006.01)
  *H04R 3/00* (2006.01)

(52) U.S. Cl.
  CPC ............... *H04R 1/028* (2013.01); *H04R 1/04* (2013.01); *H04R 3/00* (2013.01); *H04R 3/04* (2013.01); *H04R 7/04* (2013.01); *H04R 7/045* (2013.01); *H04R 29/001* (2013.01); *G10K 2210/3044* (2013.01); *G10K 2210/3211* (2013.01); *H04R 2499/11* (2013.01); *H04R 2499/15* (2013.01)

(58) Field of Classification Search
  CPC ... H04R 2499/15; H04R 3/002; G06F 1/1605; G06F 3/16; G10K 11/17881; G10K 11/17885; G10K 2210/1291; G10K 2210/3211; G10K 2210/506
  See application file for complete search history.

(56) References Cited

U.S. PATENT DOCUMENTS

| | | |
|---|---|---|
| 10,237,656 B2 | 3/2019 | Lee et al. |
| 2007/0057909 A1 | 3/2007 | Schobben et al. |
| 2014/0270231 A1 | 9/2014 | Dusan et al. |
| 2014/0363008 A1 | 12/2014 | Chen et al. |
| 2016/0118035 A1 | 4/2016 | Hyde et al. |
| 2019/0066607 A1 | 2/2019 | Mitchell |
| 2019/0107893 A1 | 4/2019 | Levesque |
| 2019/0255567 A1 | 8/2019 | Lindemann |
| 2020/0037441 A1 | 1/2020 | Spivak |
| 2020/0233455 A1 | 7/2020 | Sakurai et al. |
| 2020/0273444 A1 | 8/2020 | Bernal Castillo |
| 2020/0275222 A1 | 8/2020 | Bernal Castillo et al. |

OTHER PUBLICATIONS

Heilemann M.C., et al., "Source Rendering on Dynamic Audio Displays", 2017 IEEE Workshop on Applications of Signal Processing to Audio and Acoustics, Oct. 15-18, 2017, New Paltz, NY, pp. 334-338.

Wikipedia: "Pressure", 14 Pages, 2021 (Year: 2021). Accessed from https://en.wikipedia.org/w/index.php?title=Pressure&oldid=1054778523 on Dec. 7, 2021.

FEEDBACK CONTROL FOR DISPLAY AS SOUND EMITTER

CLAIM OF PRIORITY UNDER 35 U.S.C. § 119

The present Application for Patent claims priority to Provisional Application No. 62/810,148 entitled "FEEDBACK CONTROL FOR DISPLAY AS SOUND EMITTER" filed Feb. 25, 2019 and assigned to the assignee hereof and hereby expressly incorporated by reference herein in its entirety. The present Application for Patent further claims priority to Provisional Application No. 62/893,583 entitled "SOUND LEAK CANCELLATION FOR DISPLAY AS SOUND EMITTER" filed Aug. 29, 2019 and assigned to the assignee hereof and hereby expressly incorporated by reference herein in its entirety. The present Application for Patent further claims priority to Provisional Application No. 62/893,553 entitled "FEEDBACK CONTROL FOR CALIBRATION OF DISPLAY AS SOUND EMITTER" filed Aug. 29, 2019 and assigned to the assignee hereof and hereby expressly incorporated by reference herein in its entirety.

FIELD

The present disclosure relates generally to a system for using a display to produce sound and particularly for feedback loops used to improve the audio output from vibration of the display.

BACKGROUND

Electronic devices include traditional computing devices such as desktop computers, notebook computers, tablet computers, smartphones, wearable devices like a smartwatch, internet servers, and so forth. However, electronic devices also include other types of devices with computing power such as personal voice assistants, thermostats, automotive electronics, robotics, devices embedded in other machines like household appliances and industrial tools, Internet-of-Things (IoT) devices, and the like. These various electronic devices provide information, entertainment, social interaction, security, safety, productivity, transportation, manufacturing, and other services to human users.

These electronic devices often include displays along with functionality for outputting audio (e.g., for voice calls or audio playback functions). In certain cases, it is desirable to extend the size of the display to the greatest extent possible (e.g., having the display cover the entire front facing surface (or other surface) of the electronic device). However, an audio speaker that may also occupy space is also desirable to output sound to a user facing the display. It may be desirable for systems to be able to provide audio output without taking up space on a surface of a device to allow more area for the display (e.g., to allow a display to extend to all the outer edges of the electronic device).

SUMMARY

In one aspect of the disclosure, an electronic device is provided. The electronic device includes a display. The electronic device further includes an actuator physically coupled to the display and configured to cause vibration of the display in response to an audio signal that is an input to the actuator and that is generated by an audio amplifier. The electronic device further includes a vibration sensor physically coupled to the display and configured to sense the vibration of the display due to the actuator and to output a vibration sensor signal proportional to the vibration of the display due to the actuator. In some implementations, the electronic device may further include a processor operably coupled to the vibration sensor where the processor is configured to generate an echo reference signal based on the vibration sensor signal. The echo reference signal corresponds to a representation of an acoustic output (e.g., audio output) of the display due to the vibration of the display. In some implementations, the processor may be further configured to cancel at least part of an echo signal included within a microphone input signal received by a microphone where the processor is configured to cancel the at least part of the echo signal based on the echo reference signal generated based on the vibration sensor signal from the vibration sensor.

In another aspect of the disclosure, an electronic device is provided. The electronic device includes a display. The electronic device further includes means for causing vibration of the display based on an audio signal generated by an audio amplifier to provide acoustic output from the display due to the vibration of the display. The electronic device further includes means for sensing the vibration of the display. The vibration sensing means is configured to output a vibration sensor signal proportional to the vibration of the display in response to the vibration of the display. In some implementations, the electronic device may further include means for generating an echo reference signal based on the vibration sensor signal. The echo reference signal corresponds to a representation of the acoustic output of the display. The electronic device may also further include means for canceling at least part of an echo signal included within a microphone input signal received by a microphone where the cancelling means is configured to cancel the at least part of the echo signal based on the echo reference signal generated based on the vibration sensor signal from the vibration sensing means.

In yet another aspect of the disclosure, a method for producing audio using a display is provided. The method includes vibrating the display using an actuator physically coupled to the display based on an audio signal provided as an input to the actuator and generated by an audio amplifier. The method further includes generating a vibration sensor signal using a vibration sensor physically coupled to the display. The vibration sensor signal is proportional to vibration of the display due to the actuator. In some implementations, the method may further include generating an echo reference signal based on the vibration sensor signal, the echo reference signal corresponding to a representation of an acoustic output of the display. The method may further include cancelling at least part of an echo signal included within a microphone input signal received by a microphone, where canceling the at least part of the echo signal includes cancelling the at least part of the echo signal based on the echo reference signal generated based on the vibration sensor signal from the vibration sensor.

In yet another aspect of the disclosure, a computer-readable medium storing computer executable code is provided. The code when executed by a processor causes the processor to vibrate the display using an actuator physically coupled to the display based on an audio signal provided as an input to the actuator. The code further causes the processor to generate a vibration sensor signal using a vibration sensor physically coupled to the display. The vibration sensor signal is proportional to vibration of the display due to the actuator. In some implementations, the code may further cause the processor may to generate an echo reference signal based on the vibration sensor signal, the echo reference signal corresponding to a representation of an acoustic output of the display. The code may further cause the processor to cancel at least part of an echo signal included within a microphone input signal received by a microphone, where canceling the at least part of the echo signal includes cancelling the at least part of the echo signal based on the echo reference signal generated based on the vibration sensor signal from the vibration sensor.

In yet another aspect of the disclosure, an electronic device is provided. The electronic device includes an actuator operably coupled to a component of the electronic device having an externally facing surface. The actuator is configured to cause vibration of the component in response to an audio signal generated by an audio amplifier. The electronic device further includes a vibration sensor coupled to the component and configured to output a signal proportional to the vibration of the component in response to the vibration of the component by the actuator.

In yet another aspect of the disclosure, an electronic device is provided that includes a display. The electronic device further includes an actuator physically coupled to the display and configured to cause vibration of the display in response to an audio signal provided as an input to the actuator. The electronic device further includes a vibration sensor physically coupled to the display and configured to output a vibration sensor signal proportional to the vibration of the display due to the actuator. The electronic device further includes a processor operably coupled to the vibration sensor. The processor is configured to adjust the audio signal based on the vibration sensor signal from the vibration sensor. In some implementations the processor may be further configured to adjust the audio signal in response to a force applied to the display that impacts the vibration of the display. The processor may be configured to determine an estimate of a level of the force applied to the display based on the vibration sensor signal. The processor may be configured to adjust the audio signal based on the estimate of the level of the force.

In yet another aspect of the disclosure, an electronic device is provided that includes a display. The electronic device further includes means for causing vibration of the display based on an audio signal to provide acoustic output from the display due to the vibration of the display. The electronic device further includes means for sensing the vibration of the display, the vibration sensing means configured to output a vibration sensor signal proportional to the vibration of the display in response to the vibration of the display. The electronic device further includes means for adjusting the audio signal based on the vibration sensor signal from the vibration sensing means. In some implementations, the adjusting means may be configured to adjust the audio signal in response to a force applied to the display that impacts the vibration of the display. The electronic device may further include means for determining an estimate of a level of the force applied to the display based on the vibration sensor signal. The adjusting means may be configured to adjust the audio signal based on the estimate of the level of the force.

In yet another aspect of the disclosure, a method for producing audio using a display is provided. The method includes vibrating the display using an actuator physically coupled to the display based on an audio signal provided as an input to the actuator. The method further includes generating a vibration sensor signal using a vibration sensor physically coupled to the display, the vibration sensor signal proportional to vibration of the display due to the actuator. The method further includes adjusting the audio signal based on the vibration sensor signal from the vibration sensor. In some implementations, adjusting the audio signal may include adjusting the audio signal in response to a force applied to the display that impacts the vibration of the display by the actuator. The method may further include determining an estimate of a level of the force applied to the display based on the vibration sensor signal. Adjusting the audio signal may include adjusting the audio signal based on the estimate of the level of the force.

In yet another aspect of the disclosure, a computer-readable medium storing computer executable code is provided. The code when executed by a processor causes the processor to vibrate the display using an actuator physically coupled to the display based on an audio signal provided as an input to the actuator. The code further causes the processor to generate a vibration sensor signal using a vibration sensor physically coupled to the display, the vibration sensor signal proportional to vibration of the display due to the actuator. The code further causes the processor to adjust the audio signal based on the vibration sensor signal from the vibration sensor. In some implementations, adjusting the audio signal may include adjusting the audio signal in response to a force applied to the display that impacts the vibration of the display by the actuator. The code may further cause the processor to determine an estimate of a level of the force applied to the display based on the vibration sensor signal. Adjusting the audio signal may include adjusting the audio signal based on the estimate of the level of the force.

In yet another aspect of the disclosure, an electronic device is provided that includes a display. The electronic device further includes a first actuator physically coupled to the display and configured to cause vibration of the display in response to a first audio signal provided as an input to the first actuator. The electronic device further includes a vibration sensor physically coupled to the display and configured to output a vibration sensor signal proportional to the vibration of the display due to the first actuator. The electronic device further includes a second actuator physically coupled to a portion of the electronic device different from where the first actuator is physically coupled to the display and configured to cause vibration of the portion in response to a second audio signal provided as an input to the second actuator. In some implementations, the electronic device may further include a processor configured to generate the first audio signal and the second audio signal. The processor may be configured to generate the second audio signal to have a waveform that causes a cancellation of the vibration of the portion of the electronic device that is caused by the vibration of the display.

In yet another aspect of the disclosure, an electronic device is provided that includes a display. The electronic device further includes a first means for causing vibration of the display based on a first audio signal to provide acoustic output from the display due to the vibration of the display. The electronic device further includes means for sensing the vibration of the display, the vibration sensing means configured to output a vibration sensor signal proportional to the vibration of the display. The electronic device further includes a second means for causing vibration of a portion of the electronic device different than the display based on a second audio signal. In some implementations, the electronic device may further include means for generating the second audio signal to have a waveform that causes a cancellation of the vibration of the portion of the electronic device that is caused by the vibration of the display where the second audio signal is generated based in part on the vibration sensor signal from the vibration sensing means.

In yet another aspect of the disclosure, a method for producing audio using a display that is part of an electronic device is provided. The method includes vibrating the display using a first actuator physically coupled to the display based on a first audio signal provided as an input to the first actuator. The method further includes generating a vibration sensor signal using a vibration sensor physically coupled to the display, the vibration sensor signal proportional to vibration of the display due to the first actuator. The method further includes vibrating a portion of the electronic device different from the display using a second actuator physically coupled to the portion of the electronic device based on a second audio signal provided as an input to the second actuator. In some implementations, the method may further include generating the second audio signal to have a waveform that causes a cancellation of the vibration of the portion of the electronic device that is caused by the vibration of the display.

In yet another aspect of the disclosure, a computer-readable medium storing computer executable code is provided. The code when executed by a processor causes the processor to vibrate the display using a first actuator physically coupled to the display based on a first audio signal provided as an input to the first actuator. The code further causes the processor to generate a vibration sensor signal using a vibration sensor physically coupled to the display, the vibration sensor signal proportional to vibration of the display due to the first actuator. The code further causes the processor to vibrate a portion of the electronic device different from the display using a second actuator physically coupled to the portion of the electronic device based on a second audio signal provided as an input to the second actuator. In some implementations, the code may further cause the processor to generate the second audio signal to have a waveform that causes a cancellation of the vibration of the portion of the electronic device that is caused by the vibration of the display.

DETAILED DESCRIPTION

Figure 1:
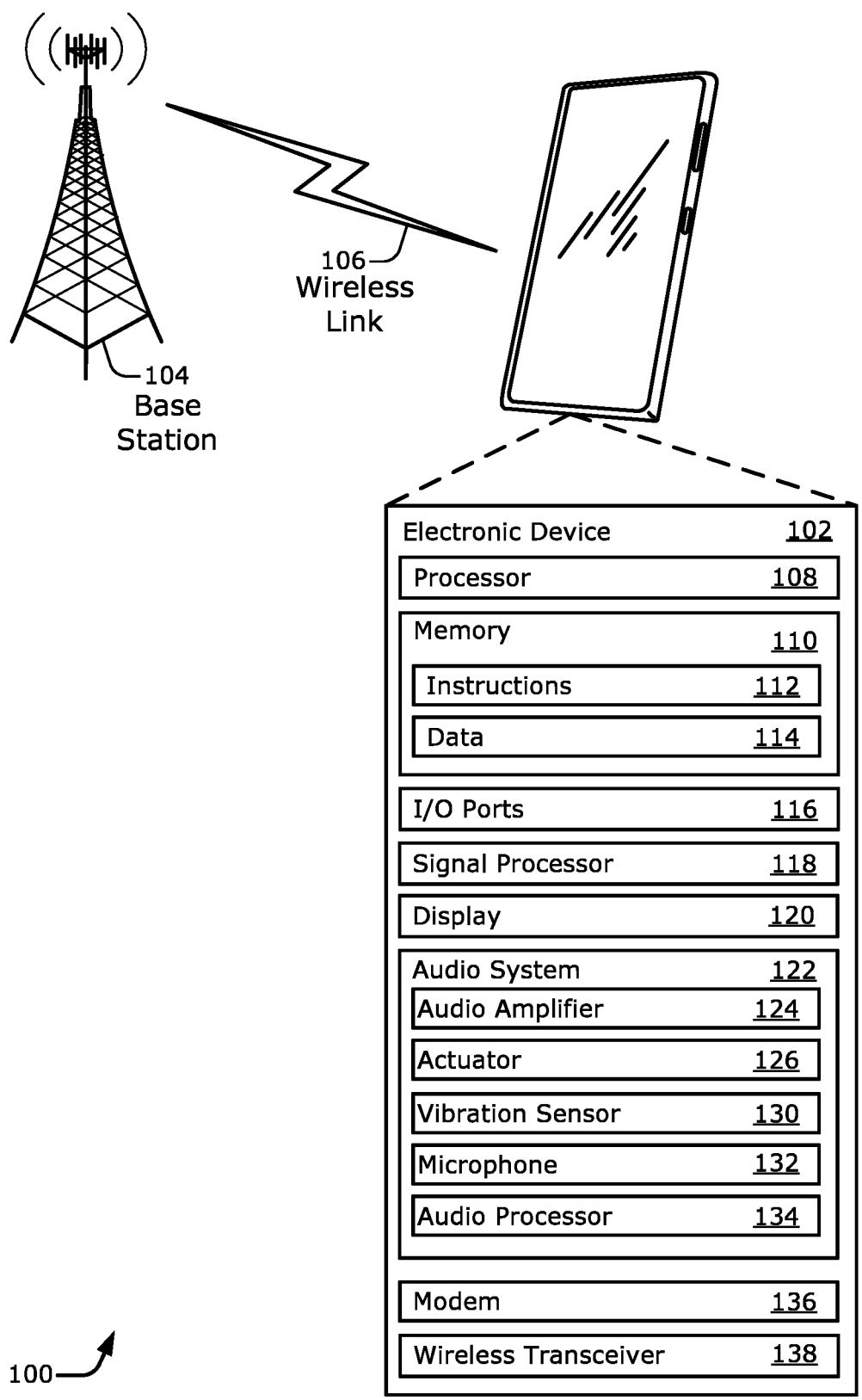
FIG. 1 is a diagram of an environment that includes an electronic device including a display and an audio system.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Aspects of the disclosure relate to using a display as a sound emitter for example, for phone calls on an electronic device such as a smartphone. In certain aspects, systems for using the display as the sound emitter are referred to as display-as-receiver (DaR) systems that are intended to replace the dynamic receiver (e.g., speaker) that plays sound in a handset mode call (or for other audio playback). Replacing the speaker and enabling the display to be a sound emitter allows for using the whole front or other surface of an electronic device as a display. Acoustic ports on the front of the electronic device are thereby not needed allowing more space for the display. This is a desirable design feature for electronic devices. In addition, for smaller electronic devices it may be desirable to use space for other purposes than for acoustic ports. In an aspect, the DaR systems are electromechanical systems that produce sound by applying a vibration on the back of the display. In certain aspects the vibration of the display is of a type that causes acoustic waves in the air to be generated based on the vibration to be heard audibly (e.g., acoustic output) and the vibration of the display may or may not be actually physically felt by the user when a user touches the electronic device. However, producing the sound with the display may create challenges in maintaining the quality of the audio output. Aspects of this disclosure relate to providing accurate feedback of the audio output of the display to improve overall audio quality. While certain aspects of the disclosure relate to using the display to output sound it should be appreciated that the principles described herein may also apply to other components of an electronic device (e.g., other surfaces of the housing or exterior facing components) which may be caused to vibrate to produce audio output.

By way of example, an element, or any portion of an element, or any combination of elements described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

FIG. 1 is a diagram of an environment 100 that includes an electronic device 102 including a display 120 and an audio system 122. In the environment 100, the electronic device 102 communicates with a base station 104 through a wireless link 106. As shown, the electronic device 102 is depicted as a smart phone. However, the electronic device 102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 104 communicates with the electronic device 102 via the wireless link 106, which may be implemented as any suitable type of wireless link. Although depicted as a base station tower of a cellular radio network, the base station 104 may represent or be implemented as another device, such as a satellite, terrestrial broadcast tower, access point, peer to peer device, mesh network node, fiber optic line, another electronic device generally as described above, and so forth. Hence, the electronic device 102 may communicate with the base station 104 or another device via a wired connection, a wireless connection, or a combination thereof. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 102 includes a processor 108 and a memory 110. The memory 110 may be or form a portion of a computer readable storage medium. The processor 108 may include any type of processor, such as an application processor or a multi-core processor, that is configured to execute processor-executable instructions (e.g., code) stored by the memory 110. The memory 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 110 is implemented to store instructions 112, data 114, and other information of the electronic device 102, and thus when configured as or part of a computer readable storage medium, the memory 110 does not include transitory propagating signals or carrier waves. In examples below, while the processor 108 may be depicted without the memory 110, it should be appreciated that in each of the examples below the processors may include a memory such as the memory 110 of FIG. 1 that may store instructions 112, data 114, and other information for performing part of or all of any of the functions or operations as depicted by functional blocks or circuitry blocks.

The electronic device 102 may also include input/output ports 116 (I/O ports 116). The electronic device 102 also includes a display 120. The I/O ports 116 enable data exchanges or interaction with other devices, networks, or users or between components of the device. The I/O ports 116 may include serial ports (e.g., universal serial bus (USB) ports), parallel ports, audio ports, infrared (IR) ports, camera or other sensor ports, and so forth. The display 120 can be realized as a screen or projection that presents graphics of the electronic device 102, such as a user interface associated with an operating system, program, or application. Alternatively or additionally, the display 120 may be implemented as a display port or virtual interface through which graphical content of the electronic device 102 is communicated or presented.

The electronic device 102 may further include a signal processor (SP) 118 (e.g., such as a digital signal processor (DSP)). The signal processor 118 may function similar to the processor and may be capable executing instructions and/or processing information in conjunction with the memory 110. In some aspects the processor 108 may be the signal processor 118. In other aspects, the processor 108 may include the signal processor 118.

For communication purposes, the electronic device 102 also includes a modem 136, a wireless transceiver 138, and an antenna (not shown). The wireless transceiver 138 provides connectivity to respective networks and other electronic devices connected therewith using radio-frequency (RF) wireless signals. Additionally or alternatively, the electronic device 102 may include a wired transceiver, such as an Ethernet or fiber optic interface for communicating over a personal or local network, an intranet, or the Internet. The wireless transceiver 138 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN). In the context of the example environment 100, the wireless transceiver 138 enables the electronic device 102 to communicate with the base station 104 and networks connected therewith. However, the wireless transceiver 138 can enable the electronic device 102 to communicate with other devices or using alternative wireless networks.

The modem 136, such as a baseband modem, may be implemented as a system on-chip (SoC) that provides a digital communication interface for data, voice, messaging, and other applications of the electronic device 102. The modem 136 may also include baseband circuitry to perform high-rate sampling processes that can include analog-to-digital conversion (ADC), digital-to-analog conversion (DAC), gain correction, skew correction, frequency translation, and so forth. The modem 136 may also include logic to perform in phase/quadrature (I/Q) operations, such as synthesis, encoding, modulation, demodulation, and decoding. Alternatively, ADC or DAC operations may be performed by a separate component or another illustrated component, such as the wireless transceiver 138 as shown.

The electronic device 102 further includes an audio system 122 that may be operably coupled to the display 120 and includes components configured to vibrate the display 120 to produce audio output (e.g., for a phone call or audio playback). The audio system 122 may be coupled to one or more of the signal processor 118 or processor 108 and may include an audio amplifier 124 configured to receive one or more electrical audio signals and output an amplified electrical audio signal. The audio system 122 may include an actuator 126 operably coupled to the audio amplifier 124 and configured to receive the amplified electrical audio signal. In this disclosure, while the actuator 126 is typically operably coupled to the audio amplifier 124 and receives an amplified audio signal from the audio amplifier 124, the signal input into the actuator 126 may be referred herein as either an audio signal or an amplified audio signal (i.e., the actuator 126 is configured to receive some type of audio signal). In addition, the audio signal generally represents an electrical representation of an information signal that is intended to carry some type of audio content such as voice information as opposed to being audible in an of itself (e.g., the audio signal is a signal that is converted eventually into an audible signal but may not be audible until the conversion). The actuator 126 may be physically coupled to the display 120 and be configured to cause the display 120 to vibrate according to the audio signal content. In an aspect, physically coupled may indicate that the actuator 126 is attached to the display 120 or at least physically coupled in a manner to cause the display 120 to vibrate. Based on the audio signal, the vibration of the actuator 126 and the physical coupling of the actuator 126 with the display 120 causes the display 120 to vibrate in a way that produces sound (e.g., acoustic output). As noted above, in certain aspects the vibration of the display 120 is of a type that causes acoustic sound waves in the air to be generated based on the vibration to be heard audibly and the vibration may or may not be actually physically felt by a user touching the electronic device 102 that includes the display 120. The audio system 122 further includes a vibration sensor 130 configured to sense vibration of the display and provide a vibration sensor signal that accurately represents the vibration of the display 120 to provide feedback as will be further described below. The audio system 122 further includes a microphone 132. The audio system 122 may further include an audio processor 134 (e.g., audio codec) with hardware and/or other components configured to process input from the vibration sensor 130 and other audio components and provides converted digital or other signals to the processor 108 or signal processor 118 for further audio processing.

Figure 2:
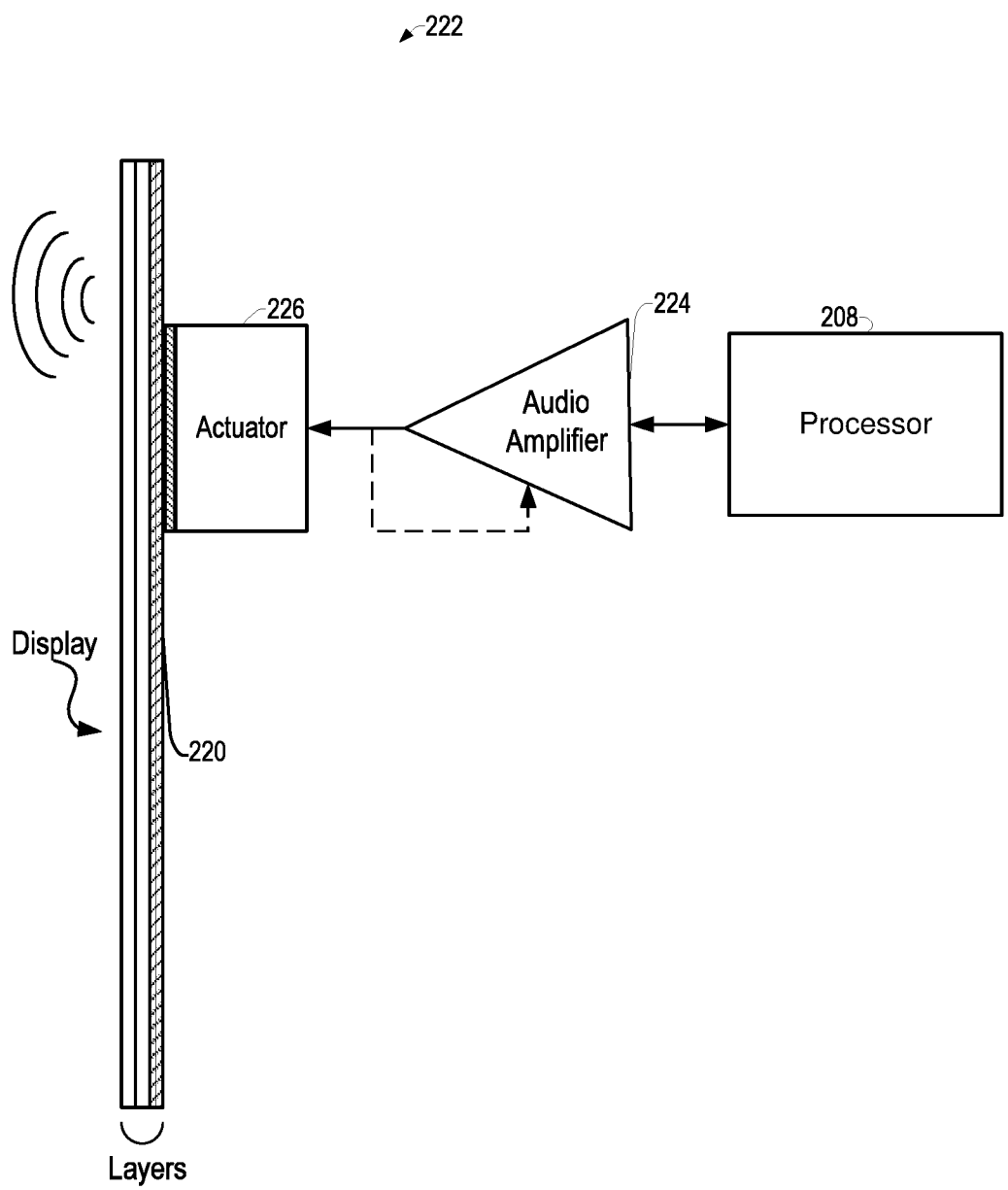
FIG. 2 is a block diagram of an example of an audio system for using a display as an audio emitter for an electronic device.

FIG. 2 is a block diagram of an example of an audio system 222 for using a display 220 as an audio emitter for an electronic device 102 (FIG. 1). The audio system 222 includes a display 220. The display 220 is illustrated as having multiple layers that together make up the display 220 to provide an example of how multiple components/layers may be combined to form the display 220. The audio system 222 includes a processor 208 similar to the processor 108 described with reference to FIG. 1. The processor 208 may include or be configured as a DSP. The processor 208 may further include other audio hardware processing components such as an audio codec for receiving input signals from audio related I/O components and converting them in a form for processing by the processor 208. The audio system 222 further includes an audio amplifier 224 operably coupled to the processor 208 and configured to receive an electrical audio signal from the processor 208 intended to be output as audio output. The audio amplifier 224 is configured to amplify and/or condition the electrical audio signal for providing to an audio output component. The audio amplifier 224 may also provide feedback to the processor 208 indicated by the double arrows on the connection between the processor 208 and the audio amplifier 224. There may be a feedback line from the output of the audio amplifier 224 to allow for sensing the amplified audio output from the audio amplifier 224 as illustrated by the dashed lines. This feedback may be provided as a feedback signal to the audio amplifier 224 and/or to the processor 208 for further adjustment of the electrical audio signal.

The audio system 222 further includes an actuator 226 (e.g., vibration actuator) operably coupled to the audio amplifier 224 and configured to receive the amplified audio signal as an input audio signal. The actuator 226 is physically coupled to the display 220 (e.g., the back side of the display 220) and is configured to cause the display 220 to vibrate according to the amplified audio signal from the audio amplifier 224. In an aspect, physically coupled may indicate that the actuator 226 is attached to or at least in contact with one or more components of the display 220 in a way that transfers vibration of the actuator 226 to the one or more components of the display 220 to cause the display 220 to vibrate according to the amplified audio signal. In an aspect, the actuator 226 is an example of a means for causing vibration of the display 220.

As noted above, in certain aspects other components or surfaces of an electronic device 102 may also be able to be coupled to the actuator 226 to produce sound besides the display 220. However, using the display 220 may be common given the orientation of the display 220 with respect to the user in most use cases and the desire to expand the display area that replaces other audio ports. The actuator 226 may include one or more elements that cause vibration of the display 220 in response to an audio signal based on a mechanical coupling between the actuator 226 and one or more components of the display 220 (e.g., the actuator 226 receives the audio signal as an input where the audio signal is an amplified audio signal generated by an audio amplifier 224 based on an electrical audio signal from a processor 208). For example, the actuator 226 may have a mass (e.g., metal plate or other resonator with mass) that is configured to vibrate according to the incoming electrical audio signal. The vibration of the mass of the actuator 226 is transferred to the display 220 based on the physical coupling of the actuator 226 with the display 220 and thereby causes vibration of the display 220. This may be in contrast to other sound emitters which vibrate an element (e.g., cone or other membrane) to cause vibration of air as opposed to vibrating physical components such as the display 220. The vibration of the display 220 is based on the audio signal and therefore the display 220 emits sound (e.g., voice) according to the audio signal (e.g., provided by the audio amplifier 224). The display 220 may be thereby used to provide sound for a voice call or other audio playback. In certain aspects, the audio signal from the audio amplifier represents an audio voice signal and the display 220 is configured to provide acoustic output corresponding to the audio signal due to the vibration of the display 220 due to the actuator 226. Other audible output in addition to audio voice signals are also contemplated.

As noted above, it may be valuable to be able to generate a signal that represents the audio output by the audio system 222 in order to create a feedback loop for improving the audio output quality. In some systems that use other types of audio emitters (e.g., typical speakers), it may be difficult to obtain an accurate reference signal that represents the audio output by the audio system 222. An additional microphone may be provided to capture the audio output. But in addition to capturing the output from the audio system 222, the additional microphone picks up other background noise and other distortions. This background noise reduces the accuracy of the signal provided by the additional microphone that was intended as an accurate representation of the audio output from the audio system 222 by itself. A feedback signal from the output of the audio amplifier 224 (and at the input of the actuator 226) may also be used. However, the signal at the output of the audio amplifier 224 fails to include signal content arising from unique characteristics of the audio emitter used as well as various other distortions impacting the audio emitter that can arise in the audio system 222. As a result, the output of the audio amplifier 224 may not be a sufficiently accurate representation of the actual audio output of the audio emitter.

In particular, when using the display 220 as the audio emitter, the particular physical characteristics of the display 220 and the way the display 220 vibrates to generate audio output may cause the signal at the output of the audio amplifier 224 to be different from a signal representing the actual acoustic output (e.g., audio output) from the display 220 (e.g., the display 220 has a unique and different audio transfer function). In such a case, the signal at the output of audio amplifier 224 may be insufficiently accurate as a reference for quality feedback about the audio output of the display 220.

Figure 3A:
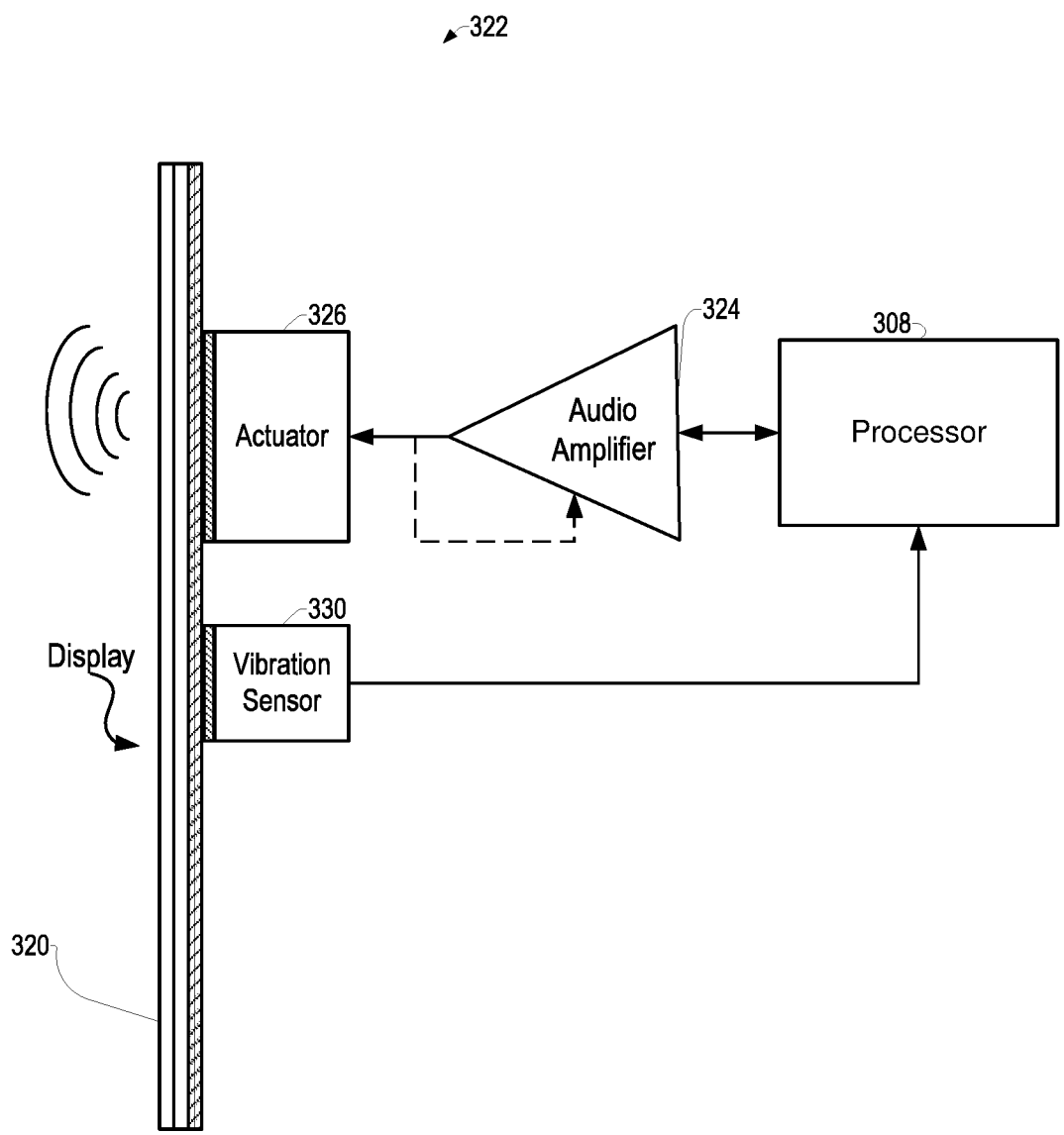
FIGS. 3A and 3B are block diagrams of examples of an audio system for using a display as an audio emitter that includes a vibration sensor in accordance with certain aspects of the disclosure.

FIG. 3A is a block diagram of an example of an audio system 322 for using a display 320 as an audio emitter that includes a vibration sensor 330 in accordance with certain aspects of the disclosure. The audio system 322 includes a processor 308, audio amplifier 324, and actuator 326 configured similarly as described above with respect to FIGS. 1 and 2. The audio system 322 further includes a vibration sensor 330. The vibration sensor 330 is physically coupled (e.g., mechanically coupled or attached) to the display 320 and is configured to sense the vibration of the display 320 due to the actuator 326 and to output a vibration sensor signal proportional to vibration of the display 320 in response to the vibration of the display 320 by the actuator 326. In an aspect, physically coupled may indicate that the vibration sensor 330 is attached or at least mechanically in contact with one or more components of the display 320. Because the vibration sensor 330 directly senses vibration of the display 320 (e.g., is vibrated along with the display), the vibration sensor signal may be an accurate representation of the vibration of the display 320 in response to the audio signal. The vibration sensor signal is used in a feedback loop to provide further audio processing benefits and/or improve the audio signal provided by the processor 308 (e.g., the vibration sensor signal captures the audio system output which then is fed back to the processor 308 generating the electrical audio signal that will be output by the display 320 and the processor 308 may adjust the electrical audio signal input to the audio amplifier 324 based on the vibration sensor signal representative of an audio or acoustic output of the audio system 322). The vibration sensor 330 is configured with a sensitivity that allows the vibration sensor signal to accurately represent the vibration of the display 320 across at least the voice frequency spectrum (or wider audio frequency spectrum).

Figure 3B:
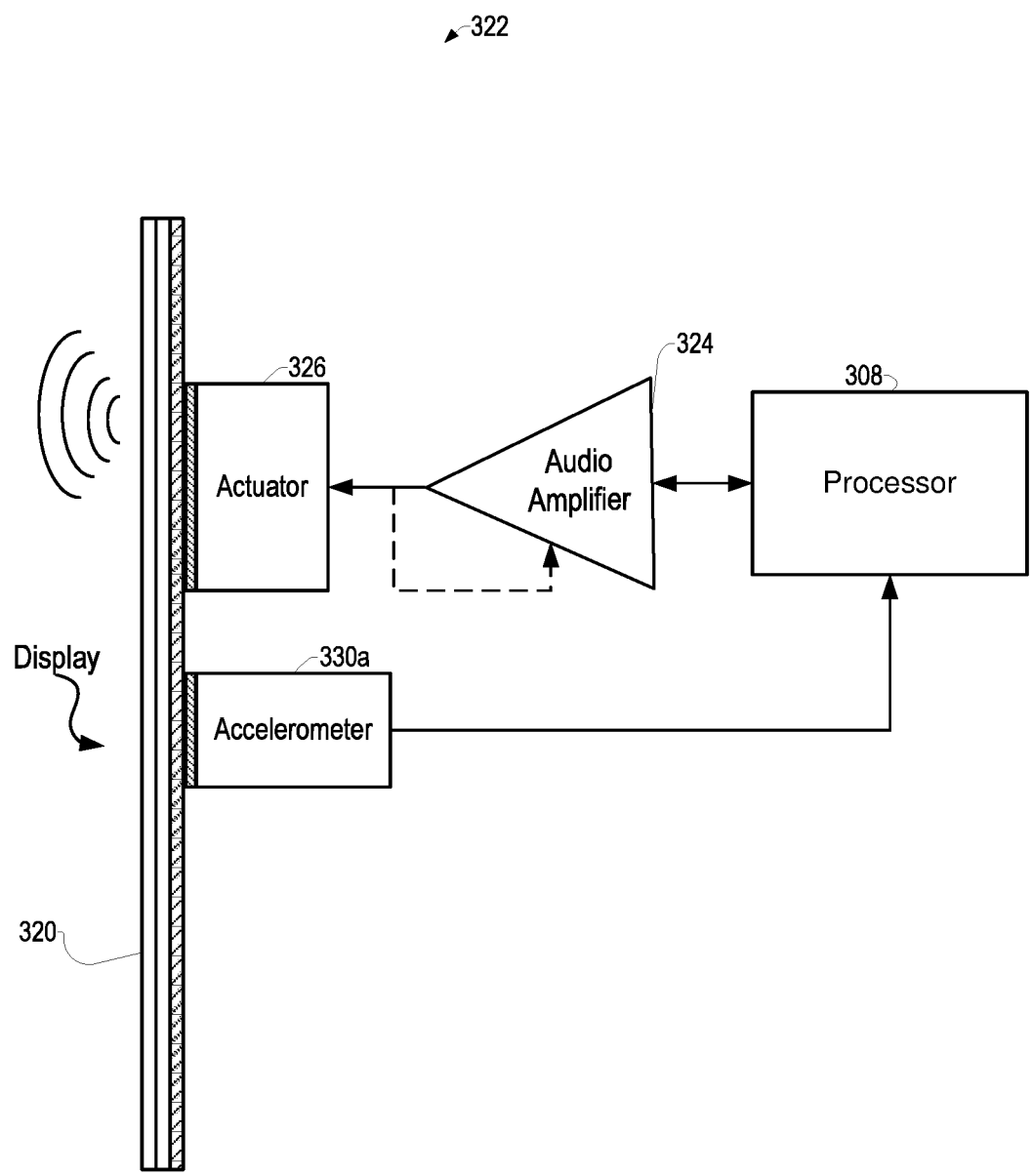

In an aspect, the vibration sensor 330 may be implemented as or include an accelerometer. FIG. 3B is a block diagram showing the accelerometer 330a as the vibration sensor 330 of FIG. 3A. In certain aspects, the accelerometer 330a is a wideband accelerometer. For example, the accelerometer 330a may be a wideband accelerometer 330a that has a bandwidth that spans frequencies in at least a voice range (e.g., up to 7 kHz or more). The bandwidth of the accelerometer 330a used as the vibration sensor 330 may be significantly wider as compared to accelerometers used for other purposes (e.g., device orientation sensors in an electronic device 102). The accelerometer 330a senses acceleration based on vibration of the display 320. In certain aspects, the accelerometer output may be an acceleration signal which is also described herein more generally as a vibration sensor signal herein for various types of vibration sensors. In certain aspects, the vibration sensor 330 (and accelerometer 330a) may be configured as a means for sensing the vibration of the display 320. Other sensors other than accelerometers may also be used or are contemplated. For example another type of piezoelectric sensor (e.g., a ceramic piezoelectric sensor and the like) or proximity probes may also be used.

More generally with reference to both FIGS. 3A and 3B, the vibration sensor 330 (or accelerometer 330a) may be configured to convert vibrations into an electrical vibration sensor signal representing the vibration of the display 320 caused by the actuator 326 (e.g., and corresponding to an audio frequency range). As one example, a vibration sensor 330 such as an accelerometer 330a, may employ piezoelectric properties or spring/mass type elements for producing the electrical vibration sensor signal. As described above, the vibration sensor 330 may be wideband as compared to other vibration sensors used for other purposes (e.g., device orientation sensors, etc.). In this sense, the vibration sensor 330 may be configured and have sensitivity to sense vibrations of the display 320 having frequencies in a particular frequency range corresponding to the audio output (e.g., configured to sense vibrations over a large audio range such as at least in the voice range between 20 Hz and 7 kHz—where larger ranges may be possible). The vibration sensor signal output may represent the vibrations over this frequency range (e.g., over the large audio range such as in the voice range) with sufficient sensitivity to provide information over the entire range to represent the audio output due to the particular physical vibration characteristics of the display 320.

The vibration sensor signal output from the vibration sensor 330 accurately represents the particular vibration of the display 320 (and corresponding acoustic output (e.g., audio output) from the display 320). The vibration sensor signal may be used as an accurate reference signal that is provided to the processor 308. The processor 308 is configured to perform additional audio processing and/or adjustment of an electrical audio signal provided to the audio amplifier 324 based on the vibration sensor signal to improve the audio output or calibrate the audio output. In an example, the processor 308 is configured to adjust an audio signal provided to the actuator 326 (e.g., via the audio amplifier 324) based on the vibration sensor signal from the vibration sensor 330. In an example, the processor 308 is configured to adjust the audio signal to adjust or compensate for the particular vibration of the display 320 due to the particular physical characteristics of the display 320 to better match a desired output. There may be many ways the audio signal may be adjusted. For example, the processor 308 may be configured to adjust a frequency response of the audio signal generated to be provided to the actuator 326 to provide an adjusted acoustic output from the display 320 due to the vibration of the display 320 by the actuator 326. Alternatively or in addition, magnitude levels of the audio signal may be adjusted (e.g., that could be frequency dependent) by the processor 308. In an aspect, because there is a feedback loop, the audio signal represents a continuous signal that is continuously updated over time such that there may be some negligible time period between providing the audio signal to the actuator 326 and when updates to the audio signal occur based on the vibration sensor signal. In any event the audio signal provided to the actuator 326 over a time period is described herein as the audio signal that is adjusted based on the vibration sensor signal over the time period. In an aspect, a method may include receiving a vibration sensor signal from the vibration sensor 330. The method may further include adjusting an audio signal provided to the actuator 326 based on the vibration sensor signal. Description of various methods and/or operations are described below in further detail.

In certain aspects, the vibration sensor 330 may be positioned relative to the actuator 326 in a region where the vibration of the display 320 is higher in magnitude. In an aspect, the vibration sensor 330 may be positioned proximate the actuator 326 because the vibration of the display 320 may be higher in the region closer to the actuator 326. For example, with respect to being proximate, in certain cases, the actuator 326 may be positioned on the display 320 close to where a user might put an ear up to listen on a phone call. In this case, the vibration sensor 330 may be positioned in this region of the display 320 as well. The vibration of the display 320 may be stronger in this region and increases sensitivity of the output of the vibration sensor 330. However, it should be appreciated that the vibration sensor 330 may be positioned in other locations relative to the actuator 326 based on other factors (e.g., placement of other components, unique physical characteristics of the display which cause varying vibration intensities, board design considerations, routing, and the like). For larger or complex systems, multiple vibrations sensors may be provided whose outputs are either combined into a single vibration sensor signal or used independently as different reference signals.

Figure 4A:
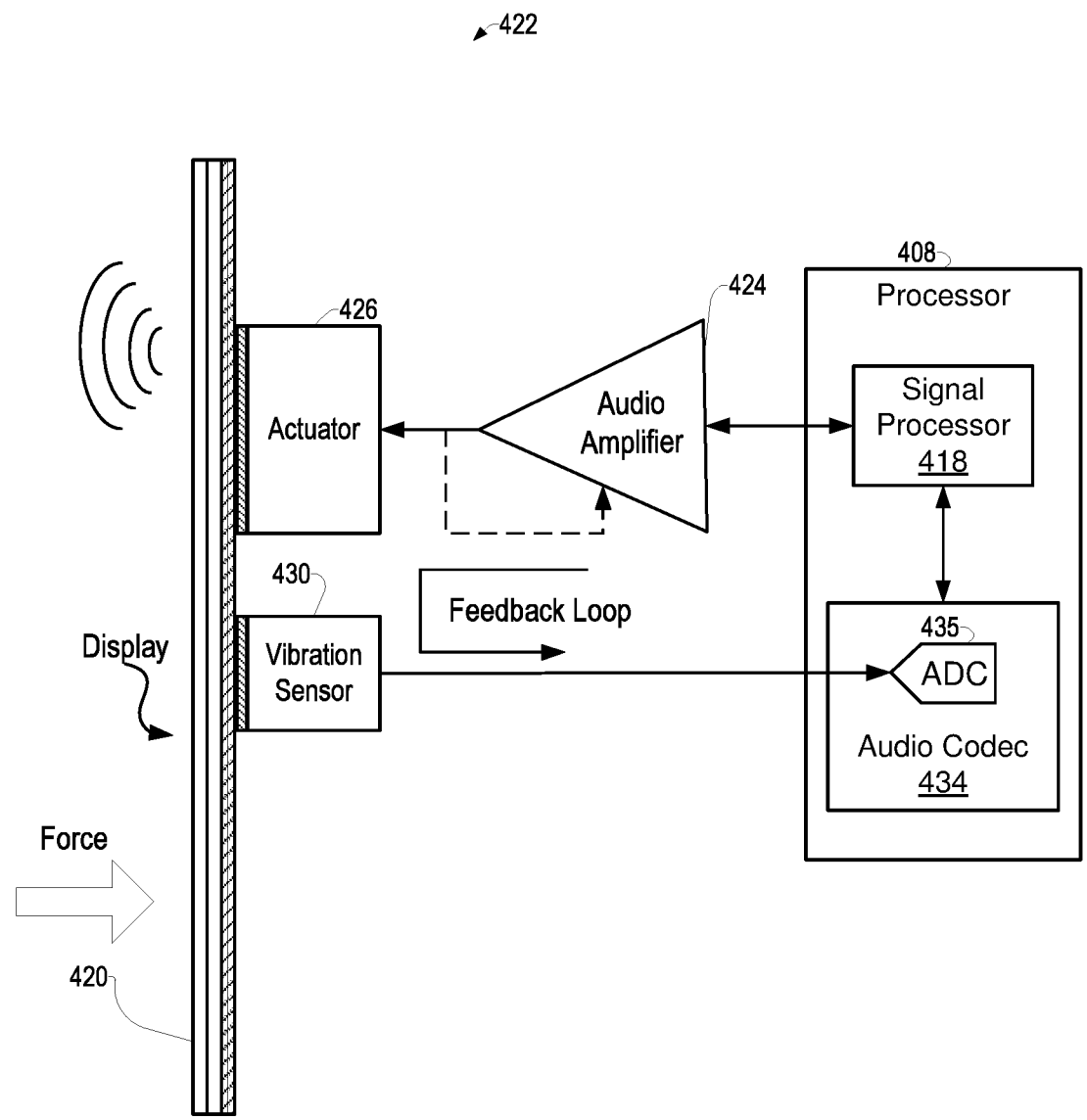
FIG. 4A is a block diagram of an example of an audio system that corresponds to the audio system of FIG. 3 and showing further functional elements or components of the processor.

FIG. 4A is a block diagram of an example of an audio system 422 that corresponds to the audio system 322 of FIG. 3A and showing further functional elements or components of the processor 408. In particular, the processor 408 may include a signal processor 418 (or in some cases the processor 408 may correspond to the signal processor 418). The signal processor 418 is configured to provide the electrical audio signal to the actuator 426 (e.g., via the audio amplifier 424). The processor 408 further includes an audio codec 434 (e.g., corresponding to audio processor 134 of FIG. 1) that may include one or more components configured to process inputs from one or more audio I/O devices (speakers, microphones, sensors, and the like) and provide them to the signal processor 418. The audio codec 434 for example may include an analog-to-digital converter circuit 435 (ADC 435) that is configured to receive a vibration sensor signal from the vibration sensor 430 and provide a digital output (e.g., digital vibration sensor signal) to the signal processor 418 based on analog signals provided by the vibration sensor 430. While not shown, the processor 408 and/or audio codec 434 may include interfaces (e.g., bus lines and other hardware) for formatting and transmitting digital signals between the ADC 435 or other elements of the audio codec 434 and the signal processor 418. While the audio codec 434 is shown as a part of the processor 408 it may be implemented together with aspects of the processor 408 or it may be implemented as a discrete chip. In addition, the vibration sensor 430 may have a digital output. Therefore, the ADC 435 may be optional or not present in certain implementations. This applies throughout the disclosure herein where while an ADC 435 is shown, if the vibration sensor 430 or other device has a digital output, the ADC 435 may not be present. Similarly, the signal processor 418 may be a discrete processor or may be part of the processor 408 (e.g., different components but integrated as a system-on-chip). The signal processor 418 may perform additional processing on the vibration sensor signal provided to the signal processor 418 via the ADC 435. The additional processing may be used to correlate the vibration sensor signal with information about the audio output of the display 420 that is predetermined during testing or simulation. The correlation may be used to generate a corresponding audio signal based on the vibration sensor signal that accurately indicates the audio output of the display 420 and may be in a signal form more compatible with processing of audio signals.

Figure 4B:
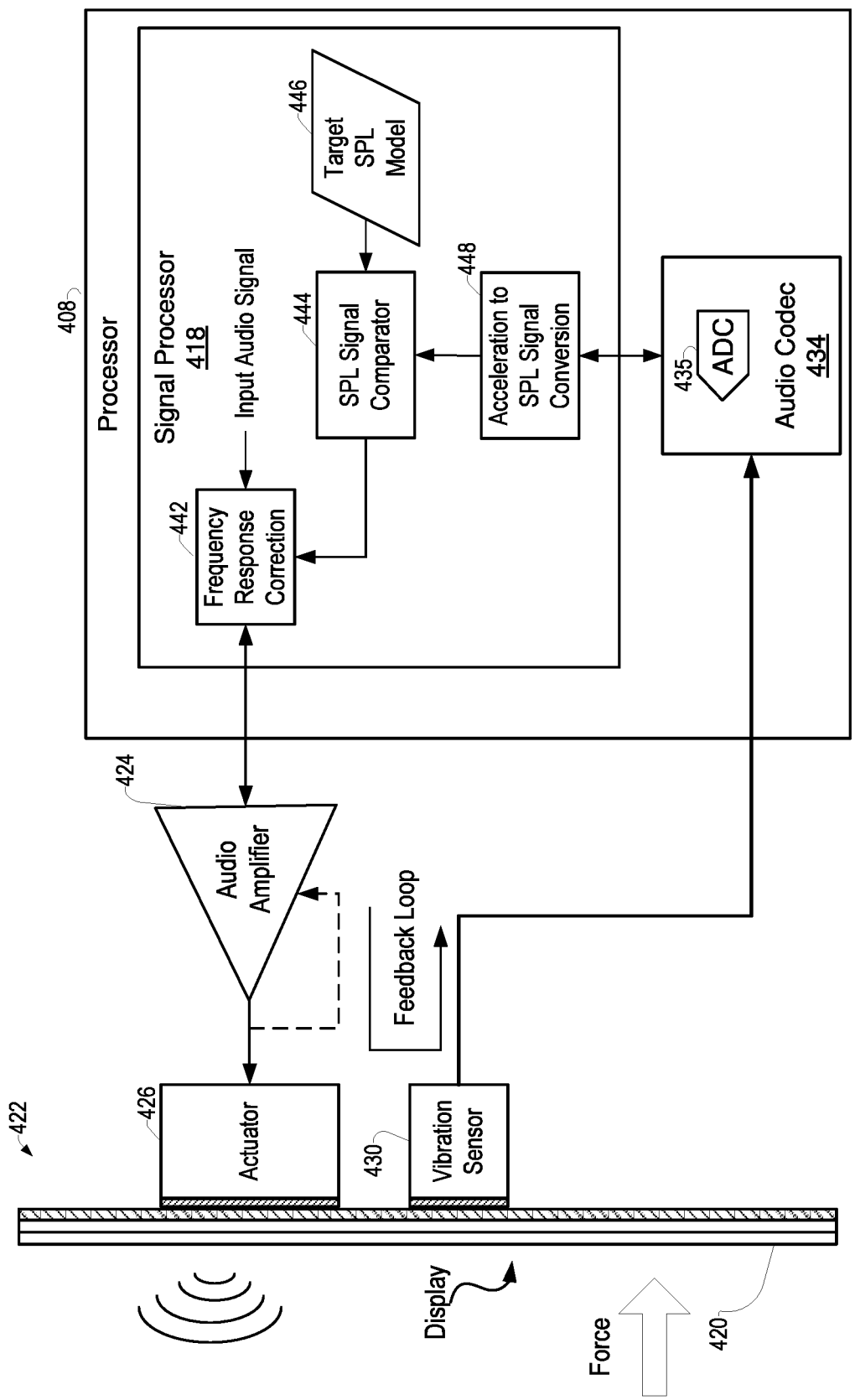
FIG. 4B is a block diagram of the audio system of FIG. 4A showing further examples of functional elements or components of the processor.

FIG. 4B is a block diagram of the audio system 422 of FIG. 4A showing further examples of functional elements or components of the processor 408. In particular, the signal processor 418 includes additional functional elements or components to illustrate examples of processing circuitry and/or operations for how the vibration sensor signal from the vibration sensor 430 is processed and used in a feedback loop to adjust the electrical audio signal provided to the audio amplifier 424. While shown as components of the signal processor 418, it should be appreciated that one or more of the components may also be implemented in the audio codec 434 or otherwise in the processor 408 generally. While each block of the signal processor 418 is described as circuitry of the signal processor 418, it should be appreciated that the circuitry may represent any combination of hardware and/or software. In general, the processor 408 may be configured to perform the function defined by each circuitry block.

The signal processor 418 includes acceleration to sound pressure level (SPL) signal conversion circuitry 448 operably coupled to the output from the ADC 435. The acceleration to sound pressure level (SPL) signal conversion circuitry 448 is configured to convert the vibration sensor signal (e.g., in some implementations corresponding to a digital vibration sensor signal after being converted by the ADC 435) to an SPL signal. Based on predetermined information about how a measured SPL signal differs from the vibration sensor signal, the signal processor 418 applies a correlation function (or performs another correlation process) to the vibration sensor signal. The generated SPL signal more closely represents an audio signal as if measured by an audio measurement device (e.g., as determined in a sound chamber) and therefore is adjusted to correspond to an audio signal similar to the type provided to the actuator 426 (or at least more compatible or similar to audio signals processed by the audio system 422).

Figure 5A:
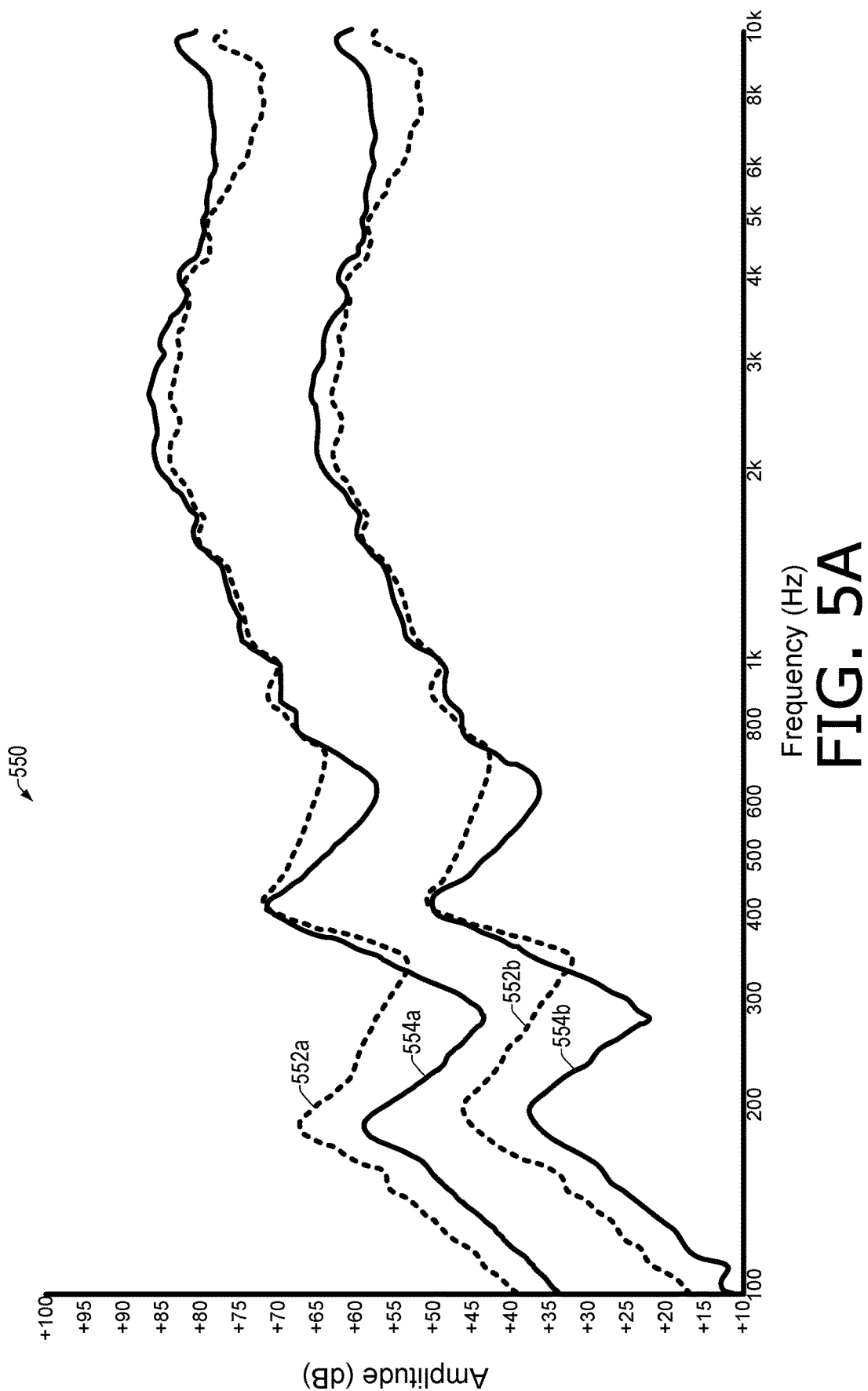
FIG. 5A is a plot showing a comparison between a vibration sensor signal from the vibration sensor and a measured sound pressure level signal across a frequency range for different sound intensity levels.

For example, FIG. 5A is a plot 550 showing a comparison between a vibration sensor signal from the vibration sensor 430 and a measured sound pressure level signal across a frequency range for different sound intensity levels (e.g., different volume levels). The dotted lines 552a and 552b represent an acceleration frequency response measured by the vibration sensor 430 for two different sound intensities (e.g., volume levels). The solid lines 554a and 554b illustrate respective frequency responses of a sound pressure level (SPL) signal as measured by a microphone in a sound chamber from the display 420 for the two different sound intensities. As illustrated, there is a high degree of correlation between the vibration sensor signal response and the SPL signal response. In addition, the relationship is substantially linear. Based on information about the correlation between the vibration sensor signal response and the SPL signal response, a function or other information may be defined that is used to adjust the vibration sensor signal during operation to better match the corresponding SPL signal it represents. As such, the processor 408 may be configured to convert the vibration sensor signal to an SPL signal (as illustrated by the acceleration to SPL signal conversion circuitry 448). Particularly, the vibration sensor signal may be used to generate a corresponding SPL signal that corresponds to an audio signal based on predetermined information about how different levels and/or frequencies of the vibration sensor signal correlate to a corresponding SPL signal.

The converted SPL signal is provided to SPL signal comparator circuitry 444 configured to compare the converted SPL signal to a target SPL model 446 (e.g., as stored in memory (not shown in FIG. 4B but as shown in memory 110 of FIG. 1)). The target SPL model 446 includes predetermined information for different frequencies/volumes that indicates desired sound output characteristics for an audio signal based on the particular physical characteristics of the display 420. For example, an audio signal can be adjusted during testing to achieve high quality sound output from the display 220 (based on characteristics unique to the display 220). This testing and/or simulation information may be used to generate a target SPL model 446 that is stored and provides information on how to adjust a converted SPL signal to better match an audio signal corresponding to what is desirable for the display 220 to output. In an aspect, the processor 408 is configured to compare the SPL signal to the target SPL model 446 representative of audio output characteristics of the display 420 (as illustrated by the SPL signal comparator circuitry 444). An adjusted SPL signal that adjusts for display sound characteristics is thereby provided based on operation of the SPL signal comparator circuitry 444.

The adjusted SPL signal is provided to frequency response correction circuitry 442 configured to receive a desired audio signal and configured to adjust the audio signal provided to the actuator 426 (e.g., via the audio amplifier 424) based on the desired audio signal and the adjusted SPL signal from the SPL signal comparator circuitry 444. The adjusted SPL signal represents a feedback signal or reference signal that represents actual output of the display 420. This information may be used to compare with the desired input audio signal (e.g., generated based on incoming audio content from other external sources such as from another end of a voice call) to adjust the audio signal provided to the actuator 426 (e.g., via the audio amplifier 424) to improve the sound quality. The frequency response correction circuitry 442 may be configured to adjust the input audio signal content at different frequencies as based on distortion (as sensed in the adjusted SPL signal that is based on the vibration sensor signal) or other characteristics that are frequency dependent. For example, the adjusted SPL signal may be used to by the frequency response correction circuitry 442 to adjust the input audio signal across the frequency range to improve the final output (e.g., adjust volumes for certain frequencies, correct for harmonic distortion as indicated in the adjusted SPL signal, or correct for other distortion that is seen in the adjusted SPL signal). As such, in an aspect, the processor 408 may be configured to adjust a frequency response of the audio signal provided to the actuator 426 (e.g., via the audio amplifier 424) based on a comparison of the SPL signal to the target SPL model 446 (i.e., based on the adjusted SPL signal). Further examples of adjustments are provided below.

In some aspects, rather than or in addition to being provided to the frequency response correction circuitry 442, the adjusted SPL signal from the SPL signal comparator circuitry 444 may be provided for some other audio processing function such as for echo cancellation as further described below to improve the overall audio system 422. Moreover, the processor 408 may be configured to adjust the audio signal provided to the actuator 426 (via the audio amplifier 424) based on any of the outputs of the elements shown in FIG. 4B. For example, the processor 408 may adjust the audio signal directly based on the vibration sensor signal as received from the ADC 435 without further processing or adjust the audio signal based on an intermediate signal. Other processing of the vibration sensor signal may also be performed by the processor 408 in addition to the functions described with reference to FIG. 4B to further process the vibration sensor signal and derive audio characteristics of the display 420 therefrom.

As shown by the plot 550, there is a high degree of correlation between measured SPL levels and the measured vibration sensor signal output from the vibration sensor 430.

This indicates that the vibration sensor signal may represent a high quality reference signal for use in a feedback loop by the processor 408.

In addition, harmonic distortion (e.g., total harmonic distortion THD) that is in the audio signal provided to the actuator 426 or present as a result of the vibration of the display 420 may also be represented in the vibration sensor signal. In other words, the vibration sensor 430 captures levels of harmonic distortion that are present in the vibration of the display 420. In fact, the correlation between a measured THD and THD in the vibration sensor signal may be well correlated in the voice frequency range (e.g., up to around 4 kHz). The presence of the THD in the vibration sensor signal may further provide a more accurate feedback signal for use in a feedback loop by the processor 408.

There may also be a delay (e.g., group delay) corresponding to the time between the audio signal is output from the audio amplifier 424 and the time the display 420 actually vibrates and creates sound. The vibration sensor 430, as it captures vibrations as the display 420 vibrates, also includes the delay in the vibration sensor signal. This may be further useful in providing an accurate feedback signal that allows the processor 408 to determine the delay and/or compensate for the delay during processing of the input audio signal based on the vibration sensor signal.

In addition, there may be some structural element or other physical aspect of an electronic device 102 that interferes with or at least impacts the vibration of the display 420. For example, there may be a screw or other element in contact with the display 420 that slightly impacts or changes vibration of the display 420. This type of distortion may be referred to as rub and buzz distortion. The vibration sensor 430 further captures rub and buzz distortion in the vibration sensor signal as any impact to the vibration of the display 420 may also thereby impact vibration of the vibration sensor 430. This may be further useful in providing an accurate feedback signal that allows the processor 408 to adjust the audio signal to cause the vibration of the display 420 to generate improved acoustic output from the display 420 (e.g., by providing the audio signal to the actuator via the audio amplifier in a way that when vibrated by the display 420 causes cancellation of the rub and buzz distortion).

Because the vibration sensor 430 may capture various distortion information, the vibration sensor 430 may provide a highly accurate reference signal that accurately represents the actual audio output by the display 420 (e.g., as compared to the audio signal provided as an input to the actuator 426). In an aspect, the vibration sensor signal differs from the audio signal at an input of the actuator 426 based at least on a transfer function representative of the vibration of the display in response to the audio signal. In another aspects, the vibration sensor signal differs from the audio signal at the input of the actuator 426 based at least in part on a physical dimension or structural characteristic of the display 420. And the vibration sensor 430 may include the distortion that is common with distortion as included in the sound output by the display 420.

External Force Feedback Loop

With reference to FIGS. 4A and 4B, the display 420 may be subject to various external forces during operation. For example, a user's ear, hands, or other objects pressed against the display 420 may apply pressure (e.g., a force) to the display 420. On a phone call, a user may place a phone (e.g., electronic device 102) on their ear applying a force in the range from 2N to 8N. These forces may impact the vibration of the display 420 thus changing the audio response of the audio system 422 and impacting how the sound is generated by the display 420. In an aspect, an acoustic resistance may be increased when a force is applied to the display 420. It therefore may be desirable to determine and/or estimate an amount of force applied to the display 420 in order to adjust the audio signal to potentially improve the audio quality or compensate for the force applied to the display 420. The impact on the sound output due to the force is not present at the output of the audio amplifier 424 and therefore a more accurate reference signal is desirable.

As shown in FIGS. 4A and 4B, the vibration sensor 430 is configured to form part of a feedback loop that provides a vibration sensor signal representing vibration of the display 420 and can be used to estimate an amount of force applied to the display 420 (e.g., estimate an amount of force applied to the display 420 by something other than the actuator 426). In an aspect, the processor 408 is configured to compare how the vibration pattern changes based on analyzing the vibration sensor signal from the vibration sensor 430 and is configured to adjust the audio signal provided to the actuator 426 (e.g., via the audio amplifier 424) based on how the pattern changes. More generally, the processor 408 is configured to adjust the audio signal based on the vibration sensor signal from the vibration sensor 430. In an aspect, the processor 408 is an example of means for adjusting the audio signal based on the vibration sensor signal. The processor 408 may be configured to adjust the audio signal in a response to a force applied to the display 420 that impacts vibrations of the display 420. In an aspect, the processor 408 is configured to determine an estimate of a level of force applied to the display 420 based on the vibration sensor signal from the vibration sensor 430. The processor 408 is then configured to adjust the audio signal applied to the actuator 426 (e.g., via the audio amplifier 424) based on the estimate of the level of force (the force applied by something other than the actuator 426). In aspects, the processor 408 is an example of means for determining an estimate of the level of the force.

In an aspect, if a force is applied to the display 420 (effectively dampening the vibrations and therefore sound output), the processor 408 may be configured to boost the audio signal as result. For example, the processor 408 may be configured to increase a magnitude (e.g., an intensity level) of the audio signal based on the estimate of the level of the force. In some aspects, increasing the magnitude (or decreasing the magnitude) may correspond to increasing (or decreasing) a volume level of the audio signal. In some scenarios it may also be possible for the processor 408 to reduce the amplitude (e.g., magnitude) of the audio signal in response to estimating the level of the force (e.g., either when the force is removed or, for example, an ear may be close enough to be easier to hear the audio output so that the volume may need to be balanced or reduced).

The impact of the force may be frequency dependent where some frequencies of the audio output are more impacted by the force than other frequencies. As such, the processor 408 may be configured to estimate the force across different frequencies. Based on this information, the processor 408 may be configured to adjust the amplitude or other characteristics of the audio signal for different frequencies to improve the audio quality.

To estimate the force, the processor 408 may be configured to compare the vibration sensor signal to an expected reference signal (e.g., representing a signal without a force applied) and determine the estimate of the level of the force based on the comparison (e.g., compare to a threshold and determine a level of the force based on the relative magnitude difference with the threshold). Based on differences between the vibration sensor signal and the expected reference signal, the processor 408 is configured to adjust the audio signal applied to the actuator 426 (e.g., via the audio amplifier 424) based the comparison.

The processor 408 may estimate the force at some period (e.g., sample 10 time a second (as one example only)) and adjust the output when a force is applied or removed.

Figure 5B:
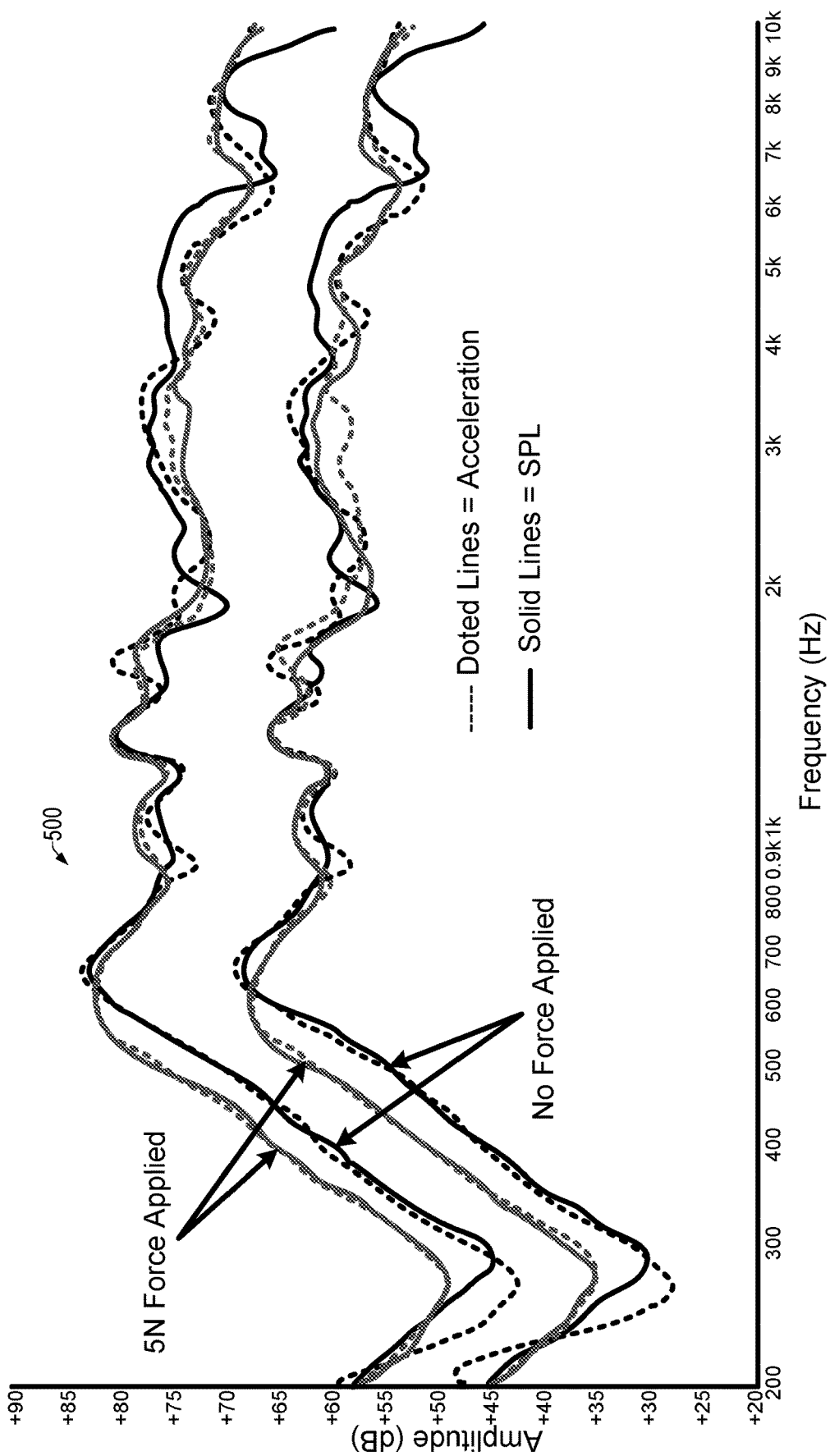
FIG. 5B is a plot showing a representation of an audio signal across frequencies based on different forces applied to the display.

FIG. 5B is a plot 500 showing a representation of an audio signal across frequencies based on different forces applied to the display 420. The y-axis represents the amplitude of the signal across different frequencies (x-axis). Similar to the plot 550 of FIG. 5A, the dotted lines represent amplitudes at different frequencies of the vibration sensor signal from the vibration sensor 430 while the solid lines represent a corresponding SPL signal measured output. Each set of lines (e.g., where a set is the dotted and solid line pair) in the plot 500 may represent a different force. The plot 500 illustrates the response for a 5N force applied to the display 420 as compared to no force applied to the display 420 for two different volume levels (e.g., the top lines are at one volume level while the bottom lines are at a different volume level). As depicted, the amplitude varies based on the force and certain frequencies are more impacted than other frequencies. The processor 408 is configured to estimate a level of force based on the vibration sensor signal and adjust the audio output to compensate for the force or otherwise take the force into account when generating the audio signal for applying to the display 420 through the actuator 426. This enables high sound quality in different scenarios and environments (e.g., and while on a voice call).

In addition, there may reach a point where there is sufficient force that the display 420 may have difficulty vibrating (e.g., a saturation situation). This condition may be frequency dependent where for certain forces at particular frequencies, the ability for the display 420 to vibrate at those frequencies may be impaired. For example, a protection case/cover may be added to the electronic device which impacts how the display 420 vibrates. The force from the case or otherwise may be estimated by the processor 408 based on the vibration sensor signal from the vibration sensor 430 and the processor 408 is configured to adjust the audio signal based the information about the force and how the frequency response changes due to the force.

The processor 408 may be configured to use any of the elements of the signal processor 418 as described with reference to FIG. 4B to estimate the level of the force. For example, the processor 408 may be configured to determine the estimate the level of the force based directly on the vibration sensor signal from the ADC 435 or may determine the estimate of the level of the force based on the SPL signal provided by the acceleration to SPL signal conversion circuitry 448 or the adjusted SPL signal provided by the SPL signal comparator circuitry 444.

It should be appreciated that estimating the level of force may be one of many examples of how the audio system 422 improves the audio signal that drives and vibrates the display 420. In fact, the vibration sensor signal may be used in a variety of ways to adjust the audio signal. In this case, in general, the vibration sensor signal is used dynamically in real time to continuously provide information about how the display 420 sounds and allows the processor 408 to continuously (or at least periodically) adjust the audio signal based on the information to improve the quality of the sound output and/or adjust desired audio output characteristics. As such, volume levels, frequency response characteristics, and other audio parameters may be adjusted based on the reference vibration sensor signal. For example, distortion present in the audio output of the display 420 may be sensed via the vibration sensor signal and then compensated for such that an adjusted audio signal provided to the actuator 426 causes vibration of the display 420 in a way that reduces the distortion. As such, the processor 408 is configured to adjust the audio signal based on the vibration sensor signal from the vibration sensor 430 as part of a closed loop feedback system. In certain aspects, the vibration sensor signal may also be provided to the audio amplifier 424. In this case, the audio amplifier 424 adjusts the output of the audio amplifier 424 based on the vibration sensor signal from the vibration sensor 430. In various aspects, the audio amplifier 424 in this implementation may receive the vibration sensor signal either from the vibration sensor 430 or as a digital signal from the audio codec 434. This may be in place of or in addition to adjustments made to the electrical audio signal by the processor 408 that is provided as an input to the audio amplifier 424. As such, in addition to the dashed line showing a feedback path from the output of the audio amplifier 424 into the audio amplifier 424, there may be another optional connection between the vibration sensor 430 (or from the audio codec 434) to provide the vibration sensor signal (or digital form) to the audio amplifier 424 in addition to the signal processor 418.

In an aspect, a method may include estimating a force level applied to the display 420 based on a vibration sensor signal from the vibration sensor 430. The method may further include adjusting an audio signal applied to an actuator 426 based on the estimated force level.

Q-Factor Tracking

The resonant frequency Q-factor value of an electromechanical system including the actuator 426 and the display 420 may also be impacted by external forces (e.g., pressure) applied to the display 420 (e.g., due to user hand or user ear). The electromechanical system may have a high Q-factor that enables production of vibrations with sufficient intensity for better sound quality and the ability to achieve sufficient volumes. The high Q-factor results in large excursion values at the resonance frequency (where excursion indicates the extent of the amplitude of physical movement of the masses within the actuator 426). Changes in the Q-factor may represent changes on the excursion values around resonance. Tracking the Q-factor may allow for preventing over excursion to prevent damage to the actuator or to allow the processor 408 to adjust the audio signal applied to the actuator 426 based on changes in the Q-factor.

The vibration sensor signal from the vibration sensor 430 may be used to determine an estimate of changes in the Q-factor of the electromechanical system including the actuator 426 and the display 420 due to external forces. Because of the high Q-factor, and because the electromechanical system may generally have a single or main resonant frequency, the range of frequencies of the signal to be analyzed to determine the Q-factor may be narrow (e.g., significantly narrower relative to the frequency range of the whole audio signal).

Figure 6:
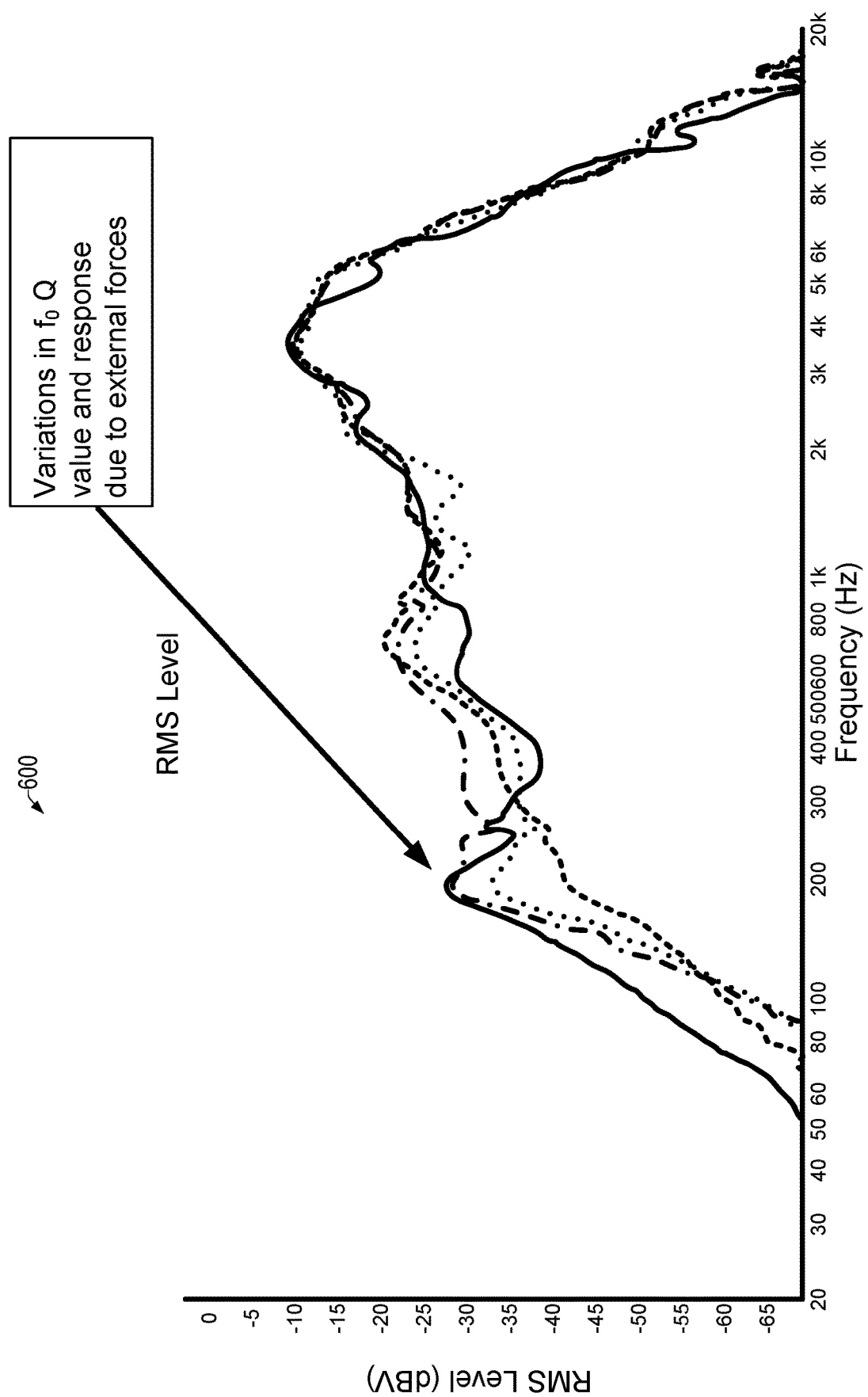
FIG. 6 is a plot showing variations in Q-factor of an electromechanical system including the display and the actuator as a result of different external forces applied to the display.

FIG. 6 is a plot 600 showing variations in Q-factor of the electromechanical system including the actuator 426 and the display 420 as a result of different external forces applied to the display 420. Each line represents the audio signal with different force applied to the display 420. The region identified by the arrow in the plot shows the region surrounding the resonant frequency of the system (e.g., as an example a peak centered around 190 Hz). In this region, the "sharpness" of the peak at the resonant frequency may correspond to the Q-factor with sharper peaks corresponding to higher Q-factors. As illustrated, the Q-factor changes significantly at different force levels applied to the display 420. The processor 408 may be configured to determine an estimated Q-factor by analyzing the vibration sensor signal around the resonant frequency of the electromechanical system and estimating the Q-factor. The processor 408 may be configured to determine changes in the Q-factor (based on the estimated Q-factor) based on the vibration sensor signal and adjust the audio signal provided to the actuator 426 (e.g., via the audio amplifier 424) based on the changes in the Q-factor. Because the resonant frequency is centered around a smaller range, the processor 408 may be configured to evaluate the vibration sensor signal within a frequency range including the resonant frequency of the electromechanical system. This frequency range may be smaller than a voice frequency range of the audio signal. In this case, the processor 408 may be configured to determine changes in the quality factor based on the evaluation with the narrower frequency range surrounding the resonant frequency.

The following equation may be used by the processor 408 to determine the Q-factor (where Fs represents the resonance frequency, Mms represents the moving mass, Cms represents compliance, Rms represents mechanical resistance, and Qms represents the mechanical Q-factor of the driver at the resonance frequency):

$$Q_{ms} = \frac{2\pi \cdot F_s \cdot M_{ms}}{R_{ms}} = \frac{1}{R_{ms}}\sqrt{\frac{M_{ms}}{C_{ms}}}$$

However, other equations or operations may be used by the processor 408 to determine an estimate of the Q-factor or track how the Q-factor changes.

In certain aspects, the vibration sensor 430 (e.g., accelerometer) in this case may have a reduced bandwidth as compared to certain other implementations (e.g., analyze the signal over a smaller frequency range around resonance) for purposes of measuring the Q-factor value. As such, in certain aspects, a less costly vibration sensor 430 may be used for this Q-factor technique.

The change in Q-factor may provide more of a course estimate of a level of external force (as compared to estimating levels of force across an entire audio frequency spectrum). In addition, there may be other uses for detecting a force (either based on the Q-factor approach or based on analyzing full frequency spectrum) applied to the display 420. For example, the processor 408 may use the information from the vibration sensor 430 to additionally detect a force to perform proximity detection and then trigger different device actions (e.g., turn off the display 420 when force is detected during a phone call, or alternatively turn on a display 420 when the force is detected to be removed, or activate a speaker phone if the force is removed). As such, the processor 408 may be configured to perform an action or change an electronic device display setting (or other electronic device setting) based on the vibration sensor signal. The information from the vibration sensor 430 may be used to identify a Q-factor and used to adapt an excursion control block (excursion again referring to the magnitude of the movement of masses in the actuator 426 that cause the actuator 426 to vibrate the display 420). This may allow for reducing a risk of over excursion or avoid reducing excursion where it is not needed. In addition, having accurate excursion information may allow the processor 408 to improve sound quality and increase loudness.

In an aspect, a method may include estimating a Q-factor value of the actuator 426 based on a vibration sensor signal from the vibration sensor 430. The method may further include adjusting an audio signal applied to an actuator 426 based on the estimated Q-factor value.

Echo Cancellation

In many audio systems, in addition to capturing sound from a user's voice as desired, a microphone may also capture/sense sound coming from a speaker of the electronic device 102 including the microphone producing an echo path. For example, the voice of someone speaking at a first device on one end of a phone call is output by the speaker of the second device. This audio is picked up by the microphone at the second device and then inadvertently transmitted back to a speaker at the first device which results in an echo path. To address this, a reference signal (e.g., echo reference) that is limited to the sound intended to be output by the speaker at the second device is desired to allow for canceling or suppressing the echo signal received by the microphone.

Figure 7:
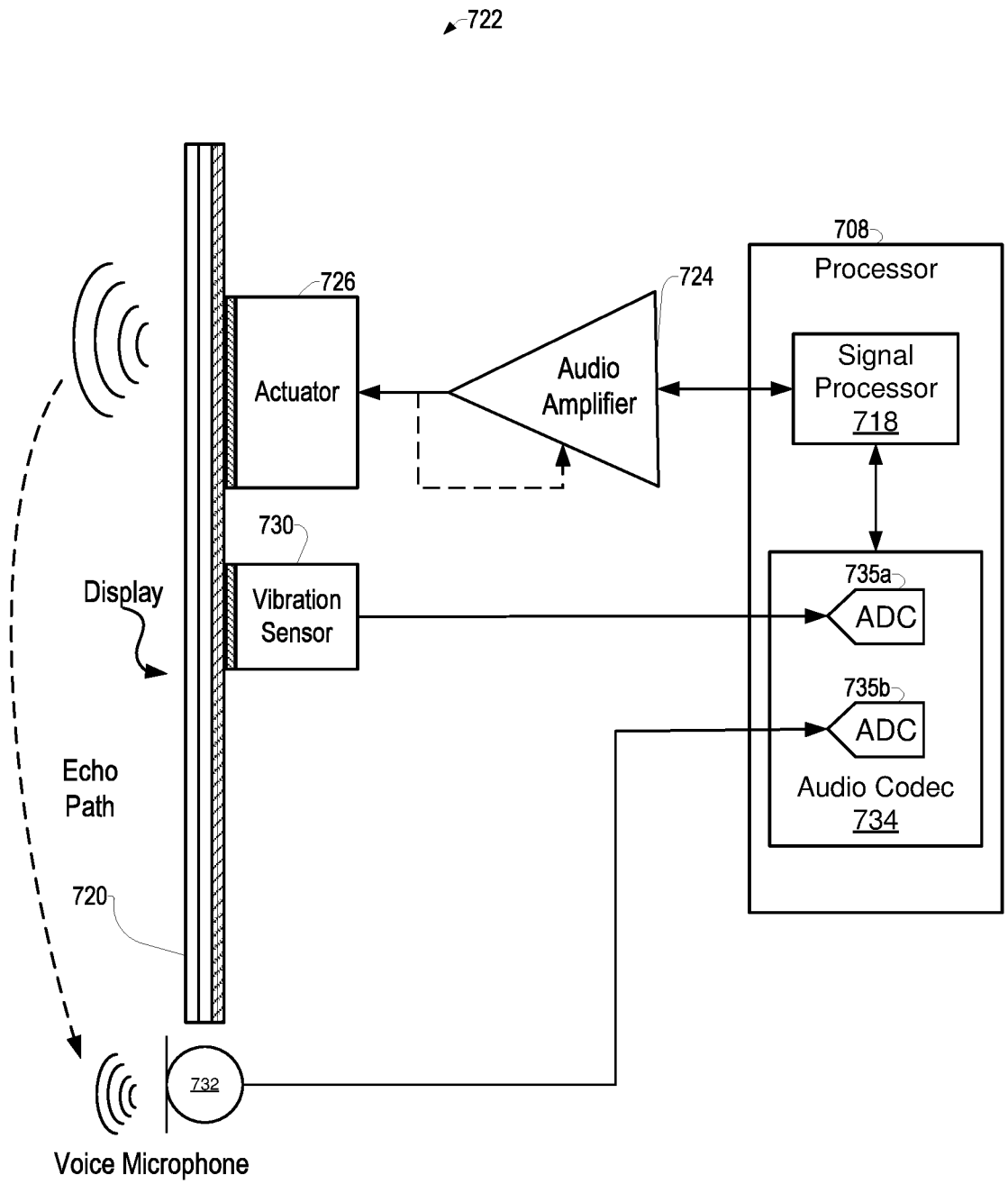
FIG. 7 is a block diagram of an example of an audio system using a display as an audio emitter that includes a vibration sensor and echo cancellation in accordance with certain aspects of the disclosure.

FIG. 7 is a block diagram of an example of an audio system 722 using a display 720 as an audio emitter that includes a vibration sensor 730 and echo cancellation in accordance with certain aspects of the disclosure. The audio system 722 of FIG. 7 includes the elements of the audio system 422 of FIG. 4A and also includes a microphone 732. The audio codec 734 includes an ADC 735b (in addition to the ADC 735a corresponding to the ADC 435 of FIG. 4A). The ADC 735b is operably coupled to the microphone 732 and provides a digital representation of the microphone signal received via the microphone 732 to the signal processor 718 (e.g., processor 708). As noted above with respect to FIG. 4, if the output from the microphone 732 is digital then the ADC 735b may not be present. The audio codec 734 may be configured to do further processing of the signal received via the microphone 732.

As illustrated in FIG. 7, the sound emitted by the display 720 may be received by the voice microphone 732 (despite the fact that in most cases the microphone 732 is intended to capture other externally generated sound such as the voice of a user). As noted above, because the microphone 732 may send what it receives to the user on the other end of the call, an echo of what that user said may be received at the other end of the call (e.g., an echo path). As such, it is desirable that the echo signal received by the voice microphone 732 be cancelled out (or at least substantially suppressed). As noted above, the transfer function based on vibration of the display 720 may differ sufficiently from the output of the audio amplifier 724 resulting in an actual display audio output signal that is different from the output signal of the audio amplifier 724. As such, the output signal of the audio amplifier 724 may not be a sufficiently accurate representation of the display acoustic output to be used for cancelling of the echo signal from the signal captured by the microphone 732.

The audio system 722 includes the vibration sensor 730 as described above that provides a vibration sensor signal that accurately represents the acoustic output of the display 720 due to the vibration of the display 720 by the actuator 726. The vibration sensor signal provides an accurate echo reference at least in part because the vibration sensor 730 is able to take into account the transfer function representing the vibration of the display 720 and the actuator 726. This echo reference signal is used to cancel the echo signal received via the microphone 732.

To provide the echo cancellation, the processor 708 is configured to generate an echo reference signal based on the vibration sensor signal from the vibration sensor 730. The echo reference signal corresponds to a representation of the acoustic output (e.g., audio output) from the vibration of the display 720 due to the vibration of the display. As described herein, the acoustic output from the display 720 may be different than an audio signal from the audio amplifier 724 input to the actuator 726 based on the unique physical properties of the display. The processor 708 is configured to cancel or suppress at least part of an echo signal included within a microphone input signal received at the microphone 732. The processor 708 is configured to cancel or suppress at least part of the echo signal based on the echo reference signal generated based on the vibration sensor signal from the vibration sensor 730. The echo signal represents acoustic output (e.g., audio output) by the display 720 that is captured by the microphone 732. The echo cancellation may be active during a voice call or other playback modes for cancelling the echo. In an aspect, the processor 708 may be an example of a means for generating the echo reference signal and a means for canceling at least a portion of the echo signal. As part of the echo cancellation the signal output from the audio amplifier 724 may also be used in conjunction with the vibration sensor signal. In this case, the processor 708 is configured to cancel the echo signal further based on a signal from an output of the audio amplifier 724. In addition, more generally, the processor 708 may be configured to adjust a microphone output signal output from the microphone 732 based on the vibration sensor signal (e.g., as for example remove or suppress any signal content from the microphone output signal that was included in the microphone output signal due to the microphone 732 capturing the sound output).

While not shown, the processor 708 and the signal processor 718 may include one or more of the components shown in FIG. 4B for processing the vibration sensor signal for echo cancellation or other purposes. As such, to generate the echo reference signal from the vibration sensor signal, the processor 408 may be configured to perform any of the functions described above with respect to the elements of the signal processor 418 of FIG. 4B (e.g., SPL signal conversion etc.). However, in some cases for purposes of echo cancellation, the output from the frequency response correction circuitry 442 or from the other circuitry may be used by the processor 708 to cancel the echo signal within the microphone input signal rather than used to adjust the audio signal provided to the actuator 726 (e.g., via the audio amplifier 724). More generally, it is noted that for purposes of echo cancellation, in certain implementations, there may not need to be an adjustment of the audio signal provided to the actuator 726 (e.g., via the audio amplifier 724) based on the vibration sensor signal. While adjusting the audio signal input to the actuator 726 may done for other purposes, for the purpose of echo cancelation, the processor 708 may be rather configured to cancel the echo signal in the microphone output signal captured by the microphone 732. A modified microphone output signal is then transmitted (with the echo cancelled) to another remote device via the transceiver 138 (FIG. 1). As such, the processor 708 may include circuitry or functionality that is configured to cancel the echo signal and otherwise process the microphone output signal for transmission or for other uses of the microphone input signal (e.g., voice assistants, etc.). It should be noted, however that both adjustment of the audio signal provided to the actuator 726 for sound quality purposes based on the vibration sensor signal and echo cancellation may be performed according to the implementations described herein.

Using the vibration sensor 730 may be particularly advantageous for echo cancellation in an audio system 722 as described with reference to FIG. 7. In particular, the entire display 720 vibrates and produces sound. Because of the size of the display 720, the microphone 732 may be always in close proximity to the vibrations regardless of the placement of the microphone 732 (in contrast to using a microphone 732 somewhat relatively distant from a speaker such as on opposite ends of a device). As such, there is less distance between the display 720 and the microphone 732 to allow for the sound to attenuate before reaching the microphone 732 when using the display 720 as the sound emitter. As such, a more accurate echo reference signal may need to be generated (e.g., by the vibration sensor 730). In addition, as described above with reference to FIGS. 4A and 4B, the vibration sensor 730 may be able to accurately capture harmonic distortion, group delay, rub and buzz distortion, and the like. This is particularly valuable during echo cancellation as at least some of the distortion captured by the vibration sensor 730 may also be captured by the microphone 732 as it captures the sound being emitted by the display 720. For example, the microphone 732 may have the group delay as described above. Because the vibration sensor signal also includes the group delay, it may be easier to align the echo signal in the microphone signal with the echo reference signal generated from the vibration sensor signal for cancellation purposes. Likewise, harmonic distortion or rub and buzz distortion captured by the vibration sensor 730 may be matched with distortion captured by the microphone 732 and leveraged for cancellation purposes. As such, the echo reference signal, that is based on the vibration sensor signal, may include harmonic distortion, group delay, rub and buzz distortion, and the like (that may correspond to similar distortion, group delay etc. that are also picked up by the microphone 732).

In addition, some systems may use additional microphones to receive and generate a representation of the echo signal. However, any such microphone may pick up background noise or other unwanted audio content which therefore includes more signal content than just the echo and would not be a clean reference signal. Using a reference signal from such an additional microphone that may include background noise may cause cancellation of more than just the echo signal in the microphone output signal thus cutting out portions of the intended signal to be transmitted. In contrast, the vibration sensor 730 creates a signal with reference to the vibration of the display 720 and would not pick up other background noise (as other external audio noise would not generally be sufficient to vibrate the display 720). This results in a strong and clean echo reference signal from the vibration sensor 730. As noted above, the vibration sensor 730 is wideband in the sense it can represent vibrations across an audio frequency range (e.g., for voice) to allow for generating a reference signal. It should be appreciated that in some instances, other sensors (e.g., a microphone) could be used to generate a portion of the echo reference signal such that the vibration sensor signal is combined with other inputs (including from the audio amplifier output) to generate the echo reference signal.

In some aspects, the vibration sensor 730 is located somewhat separate from the actuator 726 (i.e., not physically coupled to the actuator 726) so that the vibration sensor signal represents the vibration of the display 720 (due to unique transfer function of the display 720 as compared to just the actuator 726). Although, as noted above, the vibration sensor 730 may be located in the same vicinity as the actuator 726 so that vibrations are not overly attenuated by the time the vibrations reach the vibration sensor 730.

In an aspect, a method may include receiving a vibration sensor signal from a vibration sensor 730 physically coupled to the display 720. The method may further include generating an echo reference signal based on the vibration sensor signal. The method may further include receiving a microphone audio signal from the microphone 732. The method may further include cancelling an echo signal from the microphone audio signal based on the echo reference signal.

Multiple Surface Sound Emission

With reference to FIGS. 4A and 4B, because the display 420 is mechanically coupled to the back panel and other portions of the phone, the back panel and other portions of the electronic device may be subject to vibration in response to vibration of the display 420 by the actuator 426. The vibration of the back panel may cause the back panel or side panel to emit sound. This may be undesirable as other users may be able to hear sound from the back panel when standing in proximity to a voice call or generally it may be undesirable for the sound to be emitted by other portions other than the display 420.

Figure 8A:
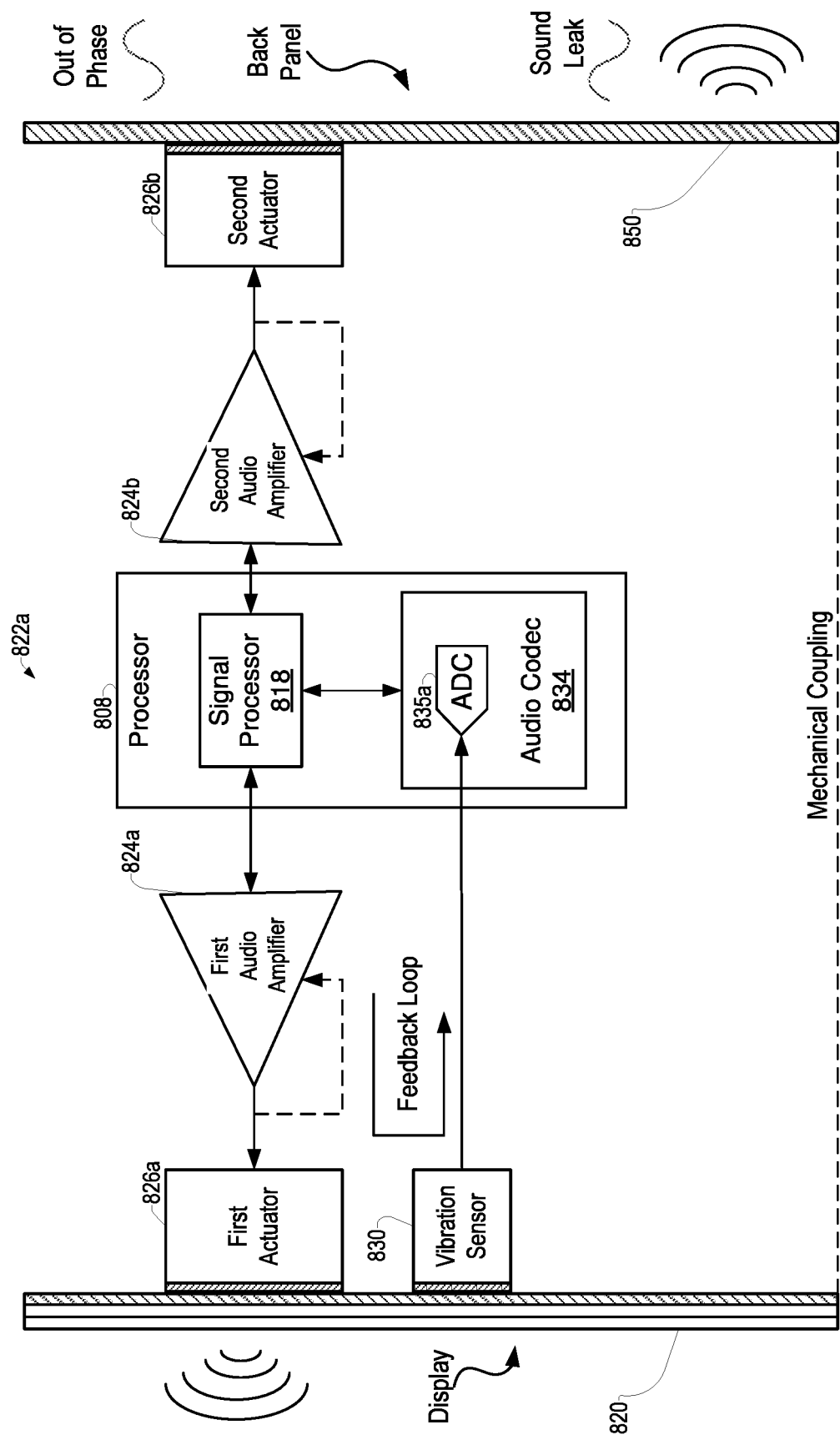
FIG. 8A is a block diagram of an example of an audio system using a display as an audio emitter that includes a vibration sensor and sound leak cancellation in accordance with certain aspects of the disclosure.

FIG. 8A is a block diagram of an example of an audio system 822a using a display 820 as an audio emitter that includes a vibration sensor 830 a in accordance with certain aspects of the disclosure. The audio system 822a shows a back panel 850 that has some mechanical coupling to the display 820. The back panel 850 may therefore vibrate in response to vibration of the display 820 by a first actuator 826a resulting in sound being emitted from the back panel 850. In order to prevent sound from being emitted from the back panel 850, the audio system 822a may cancel out vibration of the back panel 850. The audio system 822a includes the elements as described with reference to FIG. 4A including a first actuator 826a (corresponding to actuator 426), a first audio amplifier 824a (corresponding to audio amplifier 424), and vibration sensor 830 (corresponding to vibration sensor 430). The audio system 822a further includes a processor 808 which may have a signal processor 818 and an audio codec 834 similarly as described above (with ADC 835a).

The audio system 822a further includes a second actuator 826b physically coupled to the back panel 850. While shown as a back panel 850, it should be appreciated that the back panel 850 may represent any other surface or component that has mechanical coupling to the display 820 that vibrates in response to vibration of the display 820 by the first actuator 826a (e.g., the second actuator 826b may be physically coupled to a portion of an electronic device different from where the first actuator 826a is physical coupled). The audio system 822a further includes a second audio amplifier 824b operably coupled to the second actuator 826b and configured to amplify a second audio signal (e.g., provide a second amplified electrical audio signal) and provide the second audio signal as an input to the second actuator 826b. The second audio amplifier 824b is further operably coupled to the processor 808 and configured to amplify and/or condition an electrical audio signal from the processor 808 (e.g., from the signal processor 818). The second audio amplifier 824b may also provide feedback to the processor 808 indicated by the double arrows on the connection between the processor 808 and the second audio amplifier 824b as well as the dashed lines showing a feedback path from the output of the second audio amplifier 824b to the second audio amplifier 824b that can be provided to the processor 808. For example, there may be a feedback line from the output of the second audio amplifier 824b to allow for sensing the amplified audio output from the second audio amplifier 824b. This feedback may be provided in a feedback signal to the processor 808 for further adjustment of the second electrical audio signal. In certain implementations circuitry may be shared between the first audio amplifier 824a and the second audio amplifier 824b or they may form a signal audio amplifier circuit configured to provide a first audio signal to be provided to the first actuator 826a and a second audio signal to be provided to the second actuator 826b.

The second actuator 826b may be provided to vibrate the back panel 850 in a way to cancel vibrations caused by the display 820. More generally, the processor 808 is configured to provide an audio signal to the actuator 826b (e.g., via the second audio amplifier 824b) based on the vibration sensor signal from the vibration sensor 830. In an aspect, the processor 808 is configured to generate the second audio signal provided to the actuator 826b (e.g., via the second audio amplifier 824b) where the second audio signal is generated to have a waveform that causes cancellation of the vibration of the back panel 850 that is caused by vibration of the display 820. In an aspect, the second audio signal is generated based in part on the vibration sensor signal from the vibration sensor 830.

In an aspect, the processor 808 applies the second audio signal to the second actuator 826b with the same amplitude and frequency as the displacement sensed by the vibration sensor signal from the vibration sensor 830, but with a phase 180 degrees relative to the vibration sensor signal. More generally, the processor 808 is configured to generate the second audio signal to have a waveform that is out of phase with a signal generated based on the vibration sensor signal. Cancelling the vibration in the back panel 850 reduces vibration of the back panel 850 and reduces any leaked sound or generally may prevent the back panel 850 from emitting sound (or at least substantially suppresses the sound).

Figure 8B:
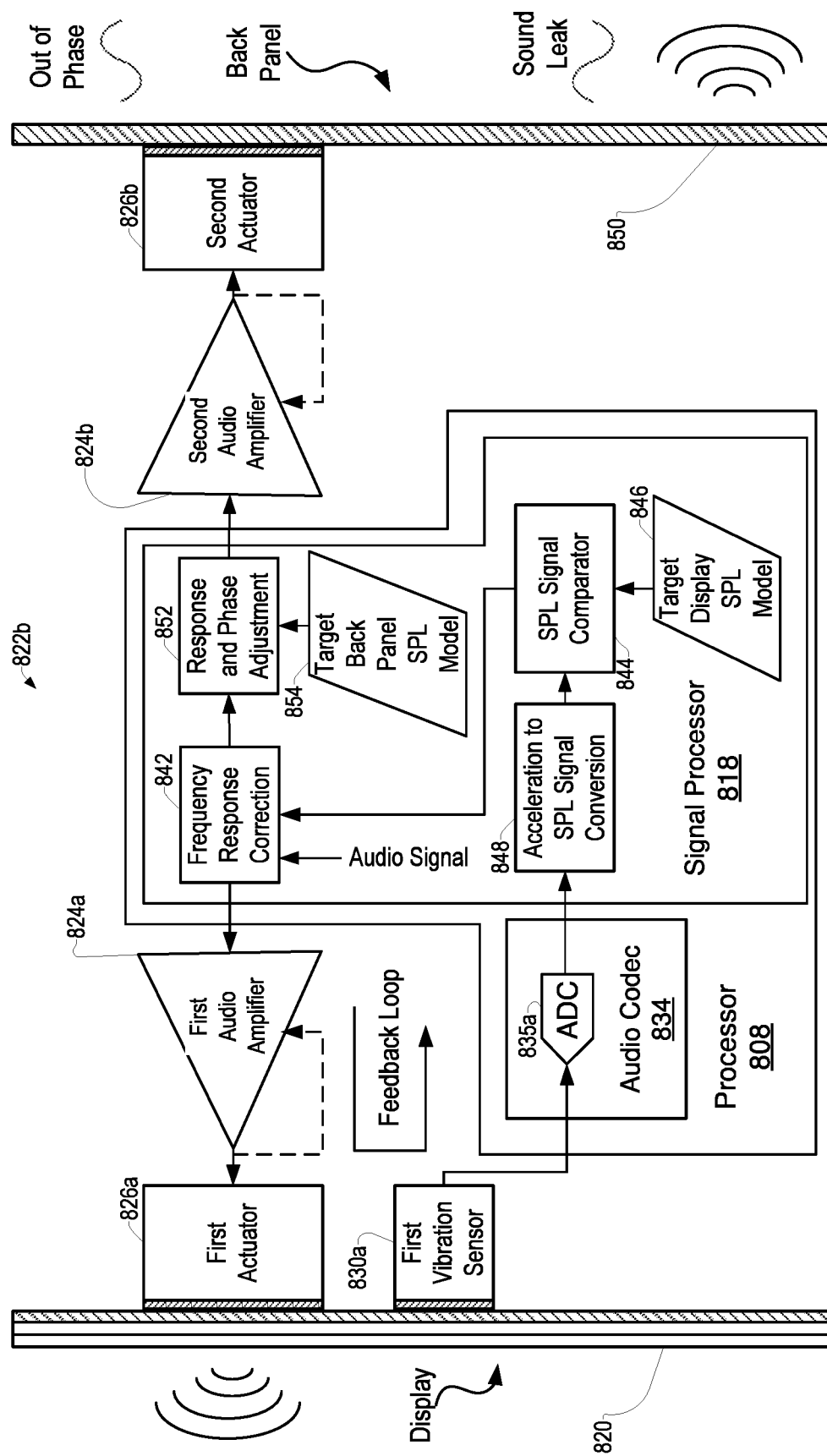
FIG. 8B is a block diagram of the audio system of FIG. 8A showing further examples of functional elements or components of the processor.

FIG. 8B is a block diagram of the audio system 822a of FIG. 8A showing further examples of functional elements or components of the processor 808. In particular, the audio system 822b of FIG. 8B includes further components illustrated as part of the signal processor 818 that are similar to those described in reference to FIG. 4B. In particular, the signal processor 818 of FIG. 8B includes the acceleration to SPL signal conversion circuitry 848, the SPL signal comparator circuitry 844, the target display SPL model 846, and the frequency response correction circuitry 842 that may operate similarly with respect to the corresponding circuitry described with reference to FIG. 4B. The resulting signal output by the frequency response correction circuitry 842 may correspond to the audio signal provided to the actuator 826a (via the first audio amplifier 824a) to be used to vibrate the display 820 after correcting for various distortion etc. as described above using the feedback path based on the vibration sensor signal.

The output from the frequency response correction circuitry 842 may also be provided to response and phase adjustment circuitry 852 configured to apply a signal to the actuator 826b (e.g., via the second audio amplifier 824b) to cause vibration of the back panel 850 via the second actuator 826b. The response and phase adjustment circuitry 852 receives the audio signal from the frequency response correction circuitry 842 and is configured to adjust the phase of the second audio signal (e.g., relative to the phase of the audio signal from the frequency response correction circuitry 842) in a way that causes the second actuator 826b to vibrate the back panel 850 to cancel vibration in the back panel 850 that would have otherwise resulted from the vibration of the display 820. In some aspects, the response and phase adjustment circuitry 852 is configured to adjust the phase of the second audio signal to be out of phase with the input audio signal from the frequency response correction circuitry 842 so that vibration of the back panel 850 results in net cancellation (or substantial cancellation or significant suppression).

The back panel 850 may have certain characteristics that cause the sound to be outputted by the back panel 850 in a unique way and different from the display 820. As a result, a target back panel SPL model 854 can be provided in memory that represents audio characteristics unique to the back panel 850 similarly as described with reference to the target display SPL model 446 described with reference to FIG. 4B. The response and phase adjustment circuitry 852 may be configured to receive input from the target back panel SPL model 854 and adjust the second audio signal based on the target back panel SPL model 854 to generate the second audio signal for vibrating the back panel 850. The second audio signal is adjusted to provide better cancellation as adjusted for audio characteristics of the back panel 850. Similar as described with reference to FIG. 4B, one or more of the components shown in the signal processor 818 may be instead implemented or be included in the audio codec 834. At least a portion of a processor 808 may include one or more components of the signal processor 818 or the audio codec 834.

Figure 8C:
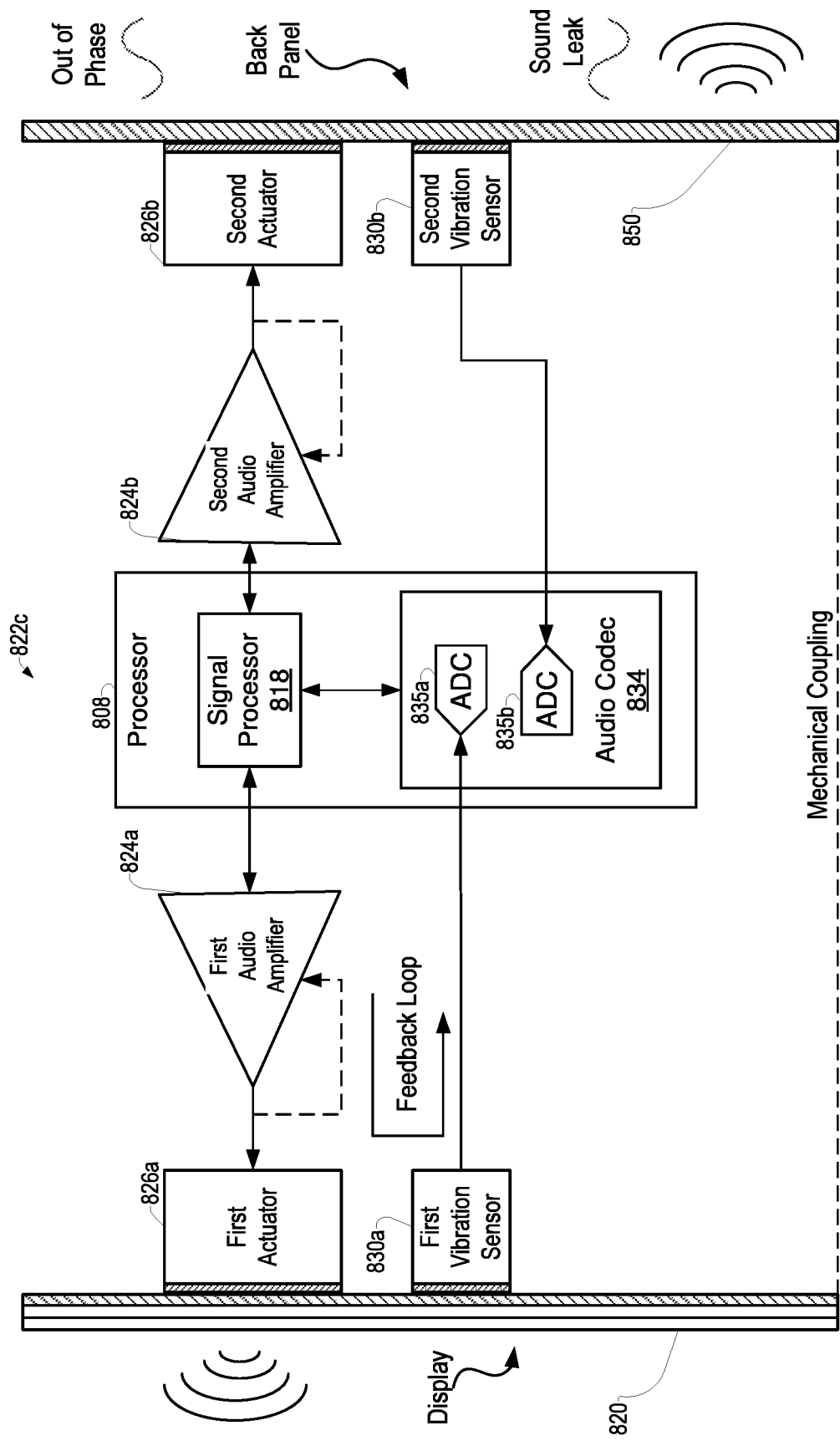
FIG. 8C is a block diagram of another example of an audio system using a display as an audio emitter that includes two vibration sensors in accordance with certain aspects of the disclosure.

FIG. 8C is a block diagram of another example of an audio system 822c using a display 820 as an audio emitter that includes two vibration sensors 830a and 830b for sound leak cancellation in accordance with certain aspects of the disclosure. The audio system 822c includes the elements of the audio system 822a of FIG. 8A and further includes a second vibration sensor 830b physically coupled to the back panel 850 and configured to output a second vibration sensor signal representing vibration of the back panel 850. The second vibration sensor 830b may be configured to provide the second vibration sensor signal to a second ADC 835b of the audio codec 834. The second ADC 835b may be configured to provide a digital signal representing the second vibration sensor signal to the processor 808. It may be beneficial to obtain additional information about particularly how the back panel 850 is vibrating. In particular, the audio system 822a of FIG. 8A may estimate the vibration of the back panel 850 based on knowledge of the audio signal provided to vibrate the display 820 and also based on information regarding how the back panel 850 vibrates during one or more tests (e.g., such as that stored in the target back panel SPL model 854 as described with reference to FIG. 8B). However, in some implementations a second vibration sensor 830b may be included in order determine how the back panel 850 particularly vibrates during operation based on a varying degree of mechanical coupling to the display 820 between devices. A vibration pattern unique to the back panel 850 may be sensed by the second vibration sensor 830b to more accurately determine the particular vibration signal at the back panel 850 to be able to cancel the vibration of the back panel 850.

The processor 808 is configured to use the second vibration sensor signal from the second vibration sensor 830b as part of a feedback loop to generate an audio signal to provide to the actuator 826b (e.g., via the second audio amplifier 824b) that causes vibration of the back panel 850 via the second actuator 826b that cancels vibrations of the back panel 850. More generally, the processor 808 is configured to adjust the second audio signal provided to the actuator 826b (e.g., via the second audio amplifier 824b) based on the second vibration sensor signal from the second vibration sensor 830b. In addition, the processor 808 may be configured to adjust the second audio signal based on a combination of the vibration sensor signal from the first vibration sensor 830a and the second vibration sensor signal from the second vibration sensor 830b (e.g., adjustment of a frequency response of the second audio signal, magnitude, and the like).

Figure 8D:
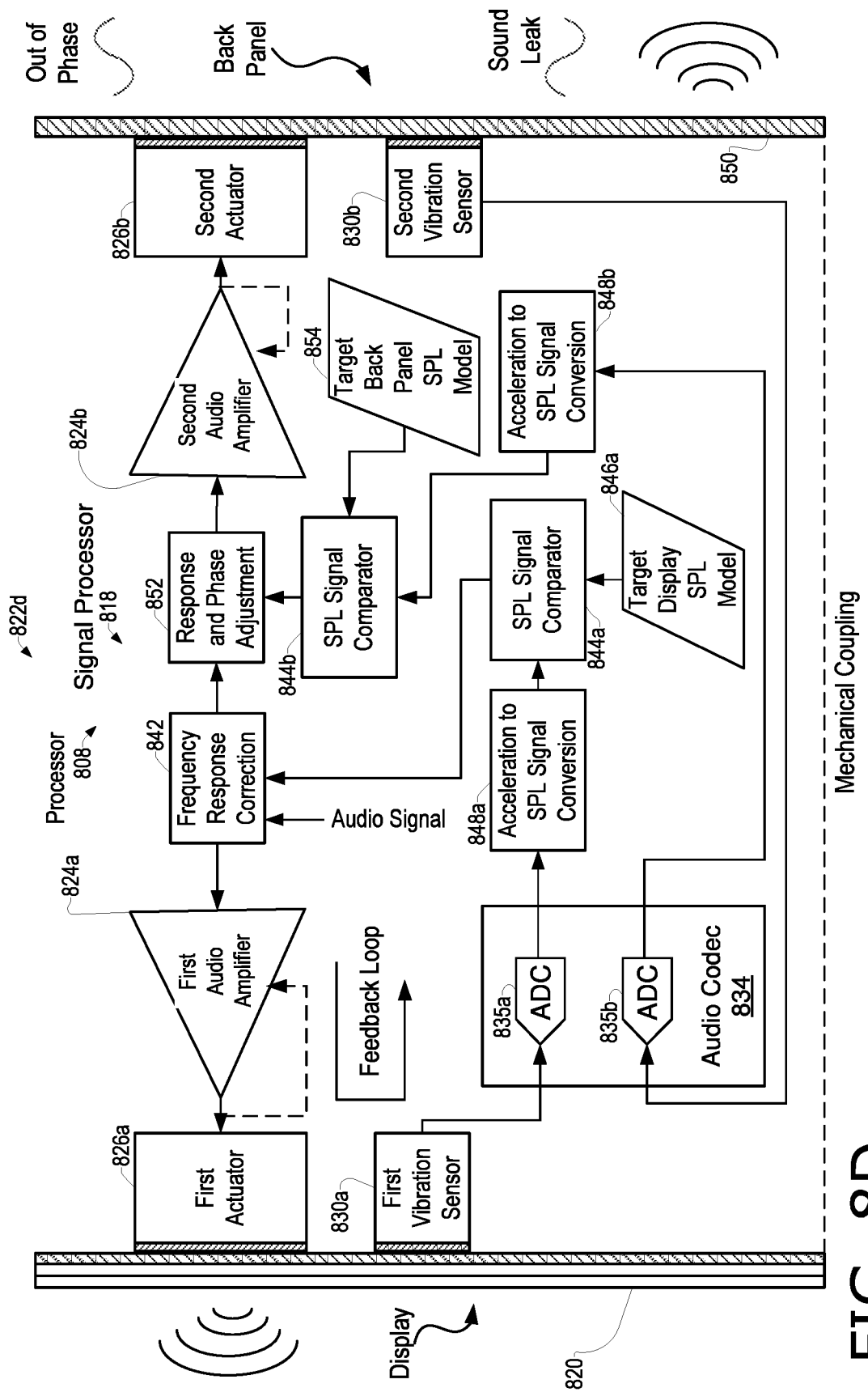
FIG. 8D is a block diagram of the audio system of FIG. 8C showing further examples of functional elements or components of the processor.

FIG. 8D is a block diagram of the audio system 822c of FIG. 8C showing further examples of functional elements or components of the processor 808. The audio system 822d of FIG. 8D includes the elements of the audio system 822b of FIG. 8B along with the second vibration sensor 830b (and second ADC 835b) of FIG. 8C. The signal processor 818 (labeled without a box to avoid visual confusion) of the audio system 822d includes additional components for processing the second vibration sensor signal. In addition to the components described with respect to the audio system 822b of FIG. 8B (shown as acceleration to SPL signal conversion 848a, SPL signal comparator circuitry 844a, and target display SPL model 846a), the signal processor 818 of FIG. 8D includes acceleration to SPL signal conversion circuitry 848b configured to convert the second vibration sensor signal to a second SPL signal based on a correlation similarly as described above with reference to the corresponding circuitry of FIG. 4B. The second SPL signal from the acceleration to SPL signal conversion circuitry 848b is provided to SPL signal comparator circuitry 844b. Similarly as described with reference to the corresponding block of FIG. 4B, the SPL signal comparator circuitry 844b is configured to compare the second SPL signal with the target back panel SPL model 854 to generate an adjusted second SPL signal that is adjusted based on audio output characteristics of the back panel 850. The adjusted second SPL signal is provided to the response and phase adjustment circuitry 852. The response and phase adjustment circuitry 852 receives both the audio signal generated for the display 820 (e.g., as output from the frequency response correction circuitry 842) in addition to the adjusted second SPL signal that represents an audio signal that is being output from the back panel 850. The response and phase adjustment circuitry 852 is configured to generate an adjusted second audio signal (e.g., out of phase) based on both the audio signal from the frequency response correction circuitry 842 and the adjusted second SPL signal. In an aspect, the second audio signal is generated to have a waveform that causes cancellation of the vibrations of the back panel 850 due to the mechanical coupling with the display 820.

Figure 9:
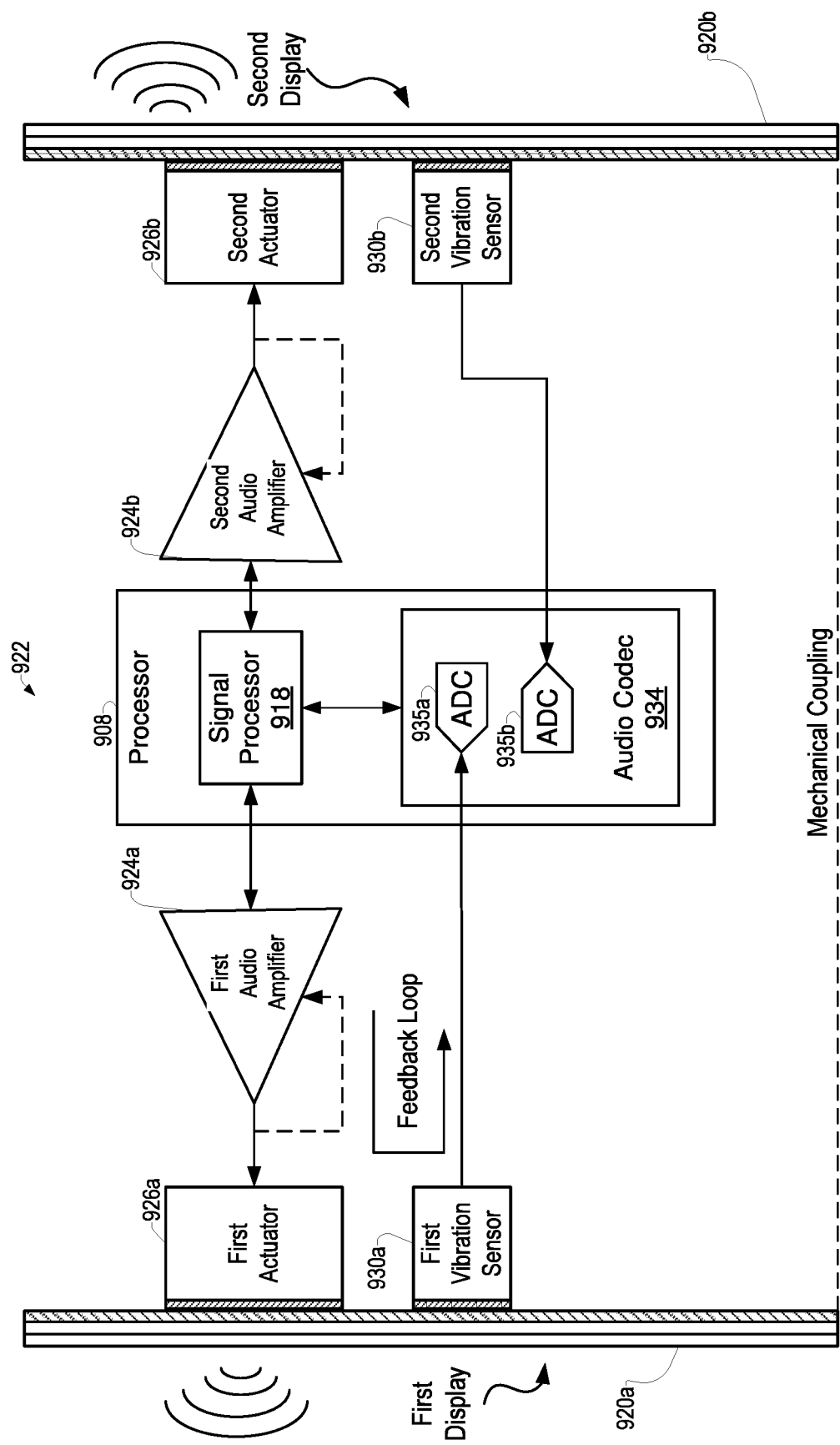
FIG. 9 shows an example of an audio system of FIG. 8C but with the back panel replaced by a second display.

In some cases, there may be more than one display, or it may actually be desirable to emit sound from the back panel 850 (or other portion of the electronic device). As such, rather than cancel the sound, an audio system 822d may be either configured to simply provide sound via the two displays or use feedback from the vibration sensors 830a and 830b to align the audio output. For example, the processor 808 may be configured to provide a second audio signal to the actuator 826b (e.g., via the second audio amplifier 824b) that is in phase with a signal based on the first vibration sensor signal of the first vibration sensor 830a physically coupled to the display 820. In another aspect, the processor 808 may be configured to provide a second audio signal to the actuator 826b (e.g., via the second audio amplifier 824b) that aligns vibration of each of the display 820 and another component with each other. As another example, because the displays may have different physical characteristics, they may have different audio responses (different transfer functions). As such it may be useful to use the vibration sensors 830*a* and 830*b* to provide feedback and then the processor 808 may adjust the audio signals for both actuators 826*a* and 826*b* to compensate or adjust for the different audio responses to improve overall sound quality (or allow for construction addition of the sound). FIG. 9 shows an example of an audio system 822*c* of FIG. 8C but with the back panel replaced by a second display 920*b*. The audio system 922 of FIG. 9 includes the elements of FIG. 8C (including a second vibration sensor 930*b*) but includes both a first display 920*a* and a second display 920*b*. The second display 920*b* could be a back panel or other panel or externally facing surface in other implementations. Any of blocks or components of FIGS. 8A, 8B, 8C, and 8D may be used in the audio system 922 of FIG. 9. But in the case of the audio system 922 of FIG. 9, the processor 908 is configured to provide a second audio signal to actuator 926*b* via the second audio amplifier in a manner that intentionally produces sound via the second display 920*b* based on vibration of the second display 920*b* by the second actuator 926*b*. In addition, each of the first vibration sensor signal from the first vibration sensor 930*a* and the second vibration sensor signal from the second vibration sensor 930*b* may be used by the processor 908 as feedback signals for adjusting one or more of a first audio signal to be applied to the first actuator 926*a* via the first audio amplifier 924*a* and a second audio signal to be applied to the second actuator 926*b* via the second audio amplifier 924*b*.

In an aspect, a method may include generating a vibration sensor signal representing a vibration of a component (e.g., back panel 850) mechanically coupled to a display 820 that is vibrating in response to a first actuator 826*a*. The method may include vibrating the component based on the vibration sensor signal to cancel vibration of the component caused by the mechanical coupling to the display 820.

Figure 10:
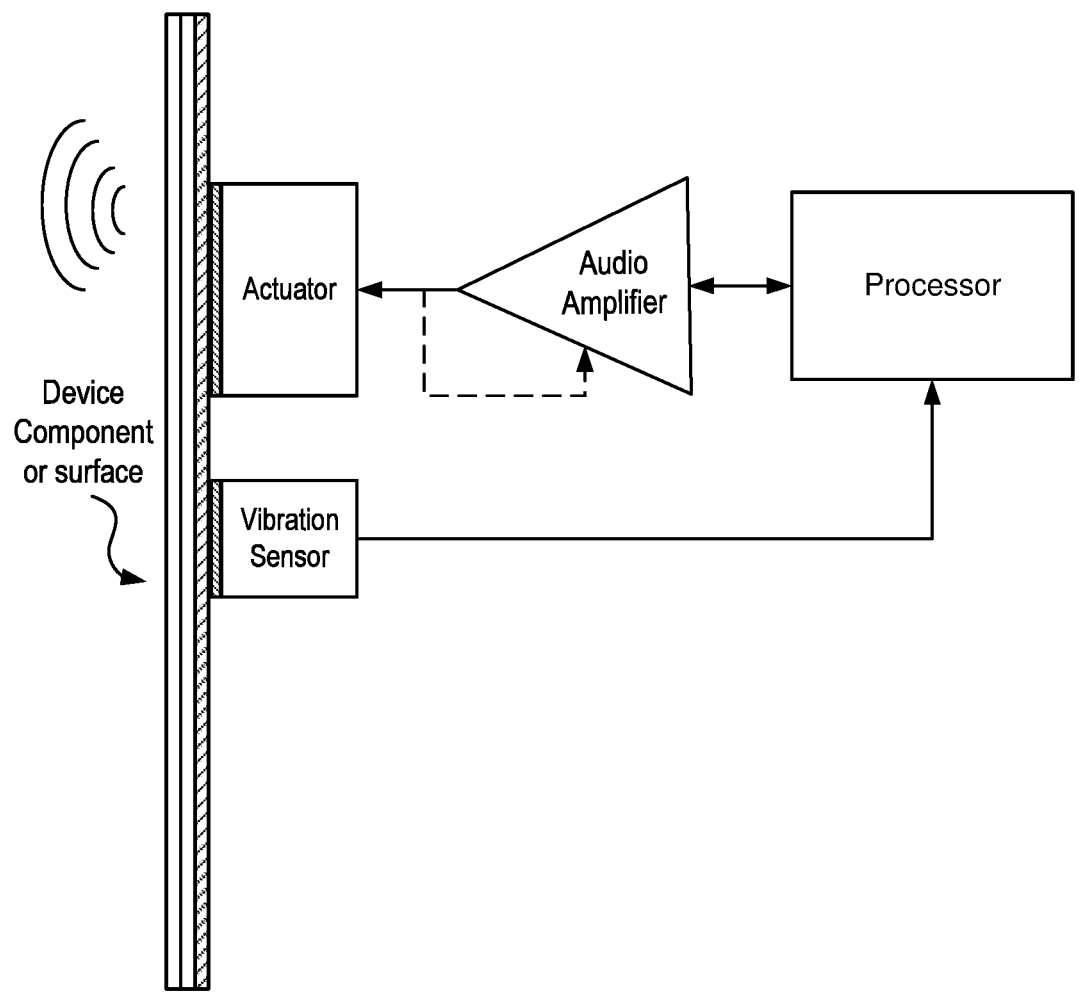
FIG. 10 shows an example of an audio system similar to FIG. 3A but replacing the display with a generic component.

FIG. 10 shows an example of an audio system 1022 similar to FIG. 3A but replacing the display with a generic component. As such other components may replace the display and emit sound. As an example, any externally facing surface or component may be selected as the sound emitter based on the principles described herein.

In general, an audio system may include an array of actuators where each of the actuators is configured to cause vibration of different portions of an electronic device in response to respective audio signals. The audio system in this case may further include an array of vibration sensors where each of the vibration sensors is configured to output respective vibration sensor signals proportional to the vibration of the different portions of the electronic device.

Example Operations

Figure 11:
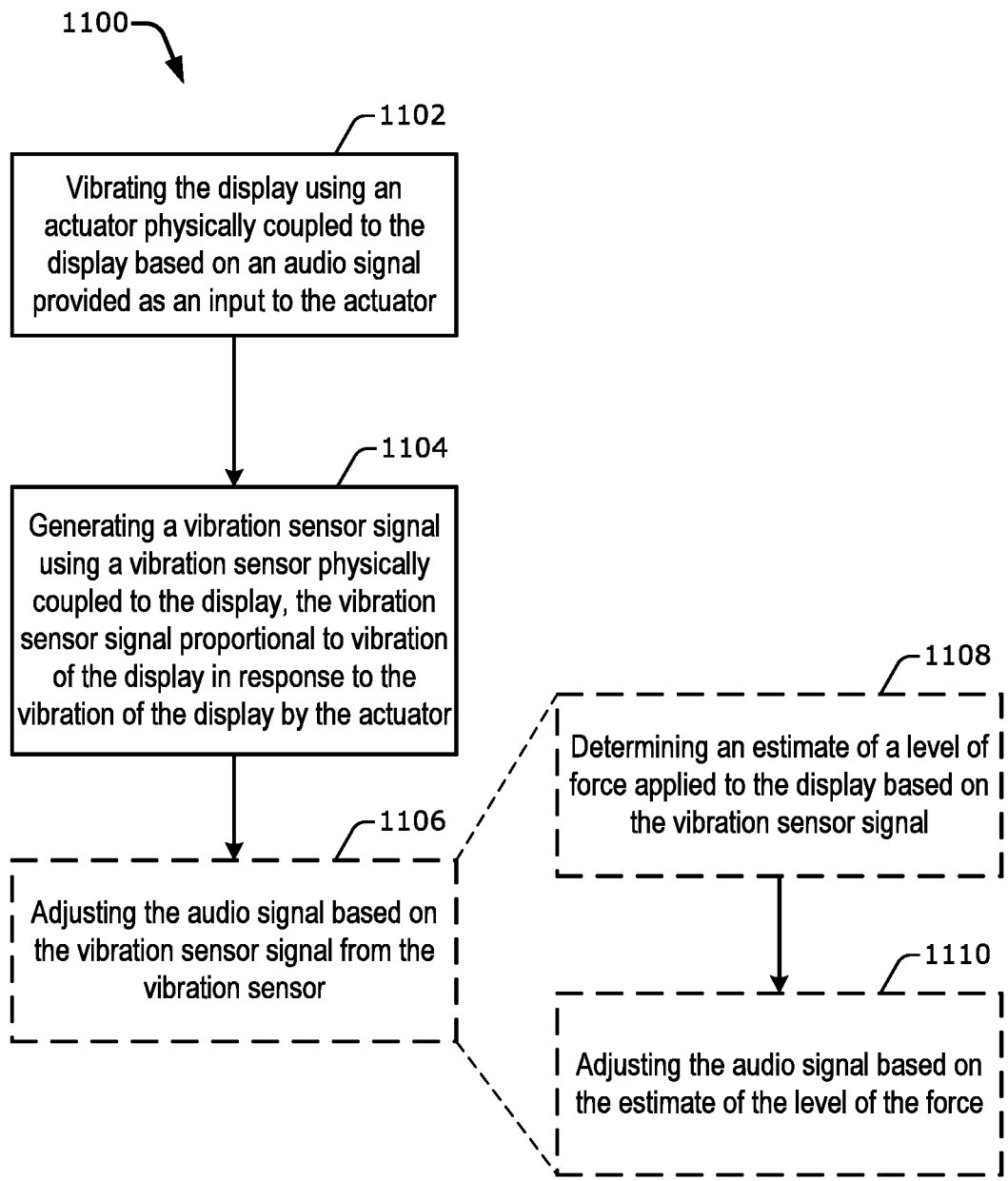
FIG. 11 is a flow chart illustrating an example of a method for producing audio using a display with reference to FIGS. 4A and 4B.

FIG. 11 is a flow chart illustrating an example of a method 1100 for producing audio using a display 420 with reference to FIGS. 4A and 4B. The method 1100 is described in the form of a set of blocks that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the method 1100, or an alternative approach. At block 1102, the method 1100 includes vibrating the display 420 using an actuator 426 physically coupled to the display 520 based on an audio signal provided as an input to the actuator 426 and generated by the audio amplifier. At block 1104, the method includes generating a vibration sensor signal using a vibra-tion sensor 430 physically coupled to the display 420. The vibration sensor signal is proportional to vibration of the display 420 in response to the vibration of the display 420 by the actuator 426.

In an aspect, at block 1106, the method 1100 may further include adjusting the audio signal provided to the actuator 426 based on the vibration sensor signal from the vibration sensor 430.

When used in the context of adjusting for a force applied to the display 420, adjusting the audio signal as depicted in block 1106 may include adjusting the audio signal in response to a force applied to the display 420 that impacts vibrations of the display 420 by the actuator 426. In this case, the operation of block 1106 may include determining an estimate of a level of the force applied to the display 420 based on the vibration sensor signal as depicted in block 1108. The method 1100 may then further include adjusting the audio signal based on the estimate of the level of the force as depicted in block 1110. Determining the estimate of the level of the force may include comparing the vibration sensor signal to an expected signal and determining the estimate of the level of force applied to the display 420 based on the comparison. The method may further include increasing a magnitude of the audio signal based on the estimate of the level of the force. One or more of the operations as described with reference to the method 1100 may be performed using the processor 408.

In some aspects, the method 1100 may further include determining changes in a quality factor (Q-factor) of an electromechanical system including the display 420 and the actuator 426 based on the vibration sensor signal and adjusting the audio signal based on the changes in the Q-factor.

Figure 12:
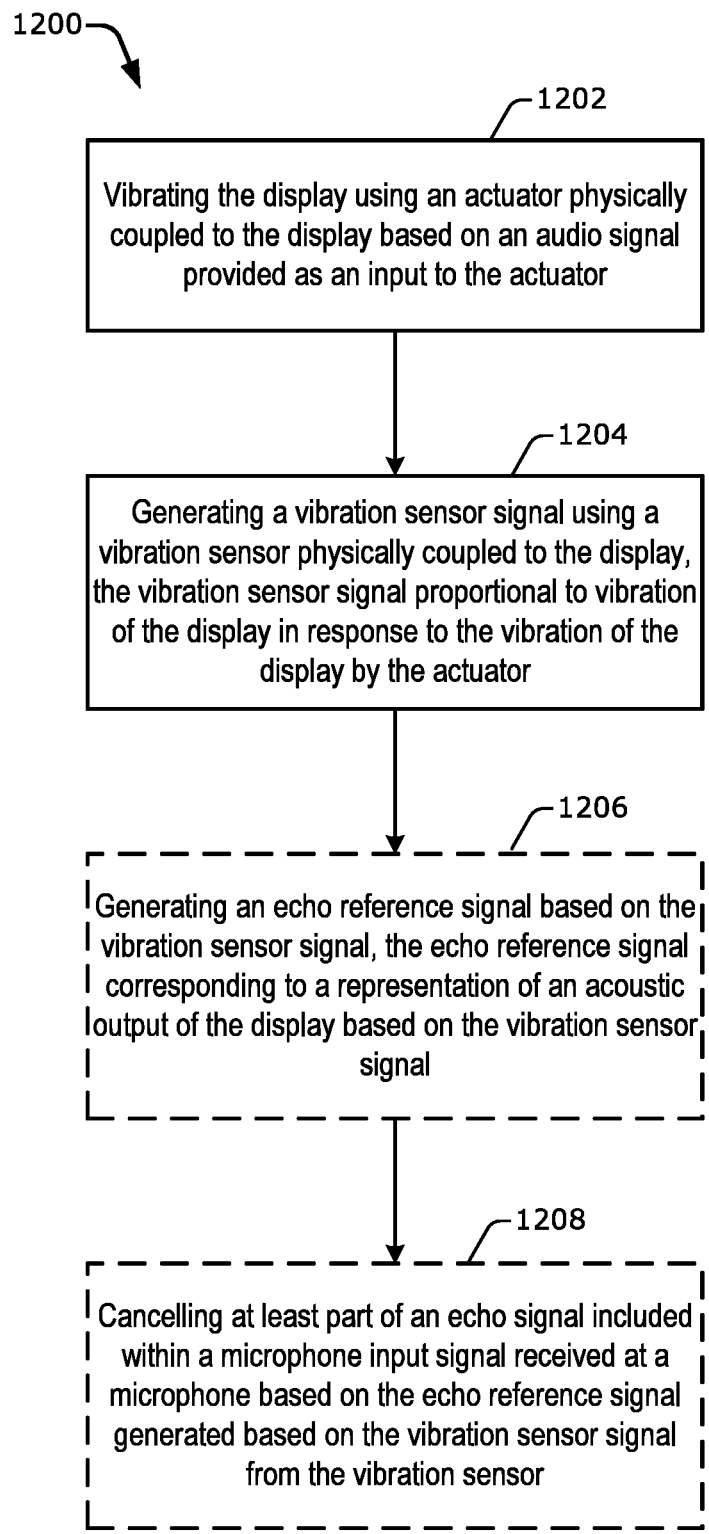
FIG. 12 is a flow chart illustrating another example of a method for producing audio using a display.

FIG. 12 is a flow chart illustrating another example of a method 1200 for producing audio using a display 420. At block 1202, the method includes vibrating the display 420 using an actuator 426 physically coupled to the display 420 based on an audio signal provided as an input to the actuator 426. At block 1204, the method 1200 further includes generating a vibration sensor signal using a vibration sensor 430 physically coupled to the display 420, the vibration sensor signal proportional to vibration of the display 420 in response to the vibration of the display 420 by the actuator 426.

With reference to FIG. 7, when used for echo cancellation, at block 1206, the method 1200 may include generating an echo reference signal based on the vibration sensor signal, the echo reference signal corresponding to a representation of an acoustic output of the display 720 based on the vibration sensor signal. At block 1208, the method 1200 may further include cancelling at least part of an echo signal included within a microphone input signal received by a microphone 732. Canceling at least part of the echo signal may include cancelling the echo signal based on the echo reference signal generated based on the vibration sensor signal from the vibration sensor 730. One or more of the operations as described with reference to the method 1200 may be performed using the processor 708. More generally, the method 1200 may include cancelling a portion of a microphone output signal from a microphone 732 of the electronic device based on the vibration sensor signal, the portion cancelled corresponding to acoustic output from the display 720 due to vibration of the display that is captured by the microphone 732.

Figure 13:
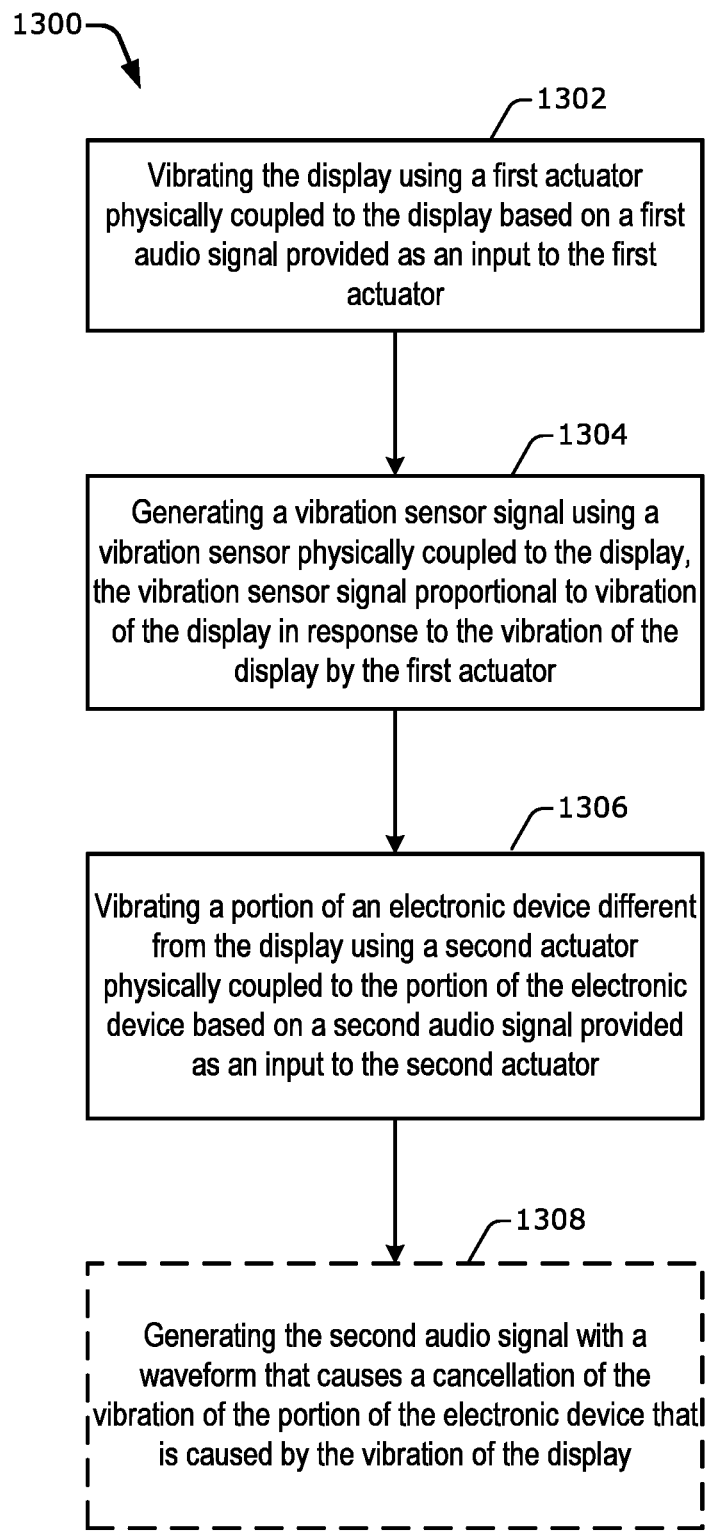
FIG. 13 is a flow chart illustrating another example of a method for producing audio using a display that is part of an electronic device.

FIG. 13 is a flow chart illustrating another example of a method 1300 for producing audio using a display 820 (FIG. 8A) that is part of an electronic device. The method 1300 is described with references to FIG. 8A. At block 1302, the method 1300 includes vibrating the display 820 using a first actuator 826a physically coupled to the display 820 based on a first audio signal provided as an input to the first actuator 826a. At block 1304, the method 1300 includes generating a vibration sensor signal using a vibration sensor 830 physically coupled to the display 820, the vibration sensor signal proportional to vibration of the display 820 in response to the vibration of the display 820 by the first actuator 826a. At block 1306, the method 1300 includes vibrating a portion (e.g., back or side panel) of the electronic device different from the display 820 using a second actuator 826b physically coupled to the portion of the electronic device based on a second audio signal provided as an input to the second actuator 826b.

In some aspects, when used in the context of sound leak cancellation, at block 1308, the method 1300 may include generating the second audio signal to have a waveform that causes a cancellation of the vibration of the portion of the electronic device that is caused by vibration of the display 820. In certain aspects, the second audio signal may be generated based in part on the vibration sensor signal from the vibration sensor 830. In some aspects, a processor 808 is configured to generate the second audio signal. When generating the second audio signal, the method 1300 may include generating the second audio signal to have a waveform that is out of phase with a signal that is based on the vibration sensor signal of the vibration sensor 830 physically coupled to the display 820.

Figure 14:
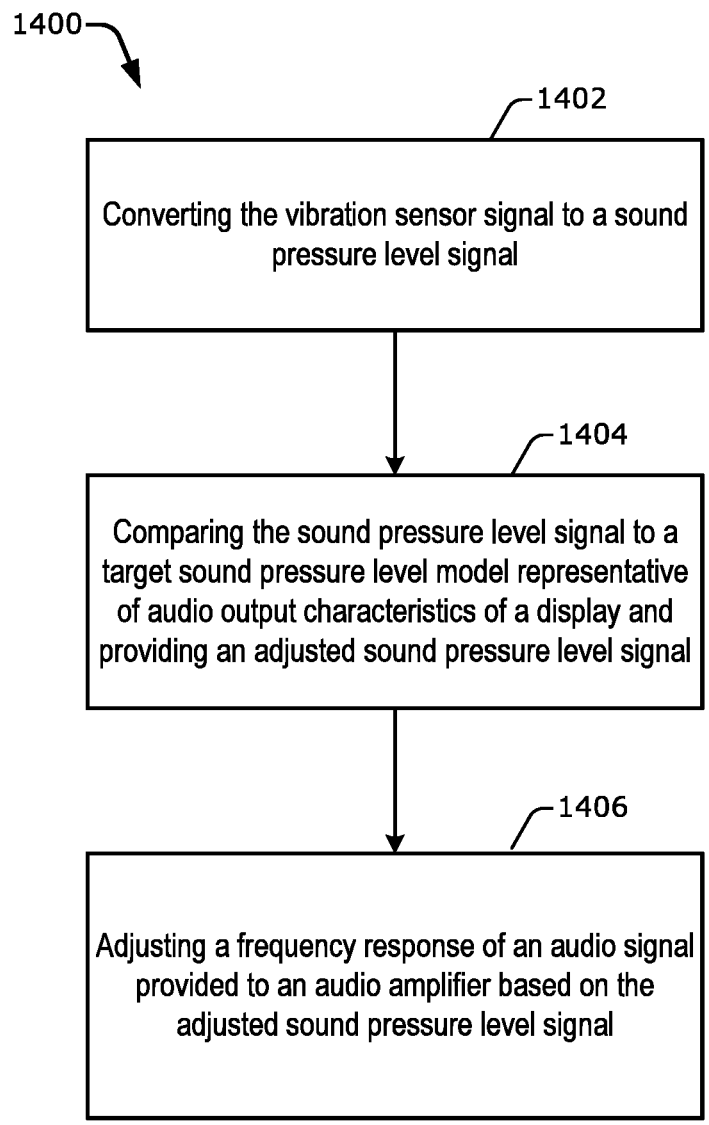
FIG. 14 is a flow chart illustrating an example of a method for processing a vibration sensor signal from a vibration sensor.

FIG. 14 is a flow chart illustrating an example of a method 1400 for processing a vibration sensor signal from a vibration sensor 430. The method 1400 is described with reference to the audio system 422 of FIG. 4B and provides examples of a portion of the processing of the vibration sensor signal. However, it should be appreciated that other processing and conditioning of the vibration sensor signal may be performed in addition to the processing described with reference to the method 1400 of FIG. 14. The method 1400 may be used to produce an audio reference signal for use in a feedback loop for purposes of calibrating or improving the audio signal provided to the display 420 via the actuator 426, for echo cancellation, for sound leak cancellation, and the like. A processor 408 (which may be a signal processor 418 in some implementations) may be configured to perform any one of the operations of the method 1400. At block 1402, the method 1400 includes converting the vibration sensor signal to a sound pressure level signal. The conversion may be based on predetermined information about a correlation between the vibration sensor signal and measured sound pressure level signals as described above. In some aspects a linear function may be applied to the vibration sensor signal to produce the sound pressure level signal. At block 1404, the method 1400 further includes comparing the sound pressure level signal to a target sound pressure level model 446 representative of audio output characteristics of the display and providing an adjusted sound pressure level signal. At block 1406, the method 1400 further includes adjusting a frequency response of an audio signal provided to the actuator 426 based on the adjusted sound pressure level signal.

The various operations of methods described above may be performed by any suitable means capable of performing the corresponding functions. The means may include various hardware and/or software component(s) and/or module(s), including, but not limited to a circuit, an application-specific integrated circuit (ASIC), or processor.

Generally, where there are operations illustrated in figures, those operations may have corresponding counterpart means-plus-function components with similar numbering.

Further examples of implementations of the disclosure are defined as follows:

1. An electronic device including a display and an actuator physically coupled to the display and configured to cause vibration of the display in response to an audio signal provided as an input to the actuator. The electronic device further includes a vibration sensor physically coupled to the display and configured to output a vibration sensor signal proportional to the vibration of the display due to the actuator. The electronic device further includes a processor operably coupled to the vibration sensor where the processor is configured to adjust the audio signal based on the vibration sensor signal from the vibration sensor.

2. The electronic device of example 1, wherein the processor is configured to adjust the audio signal in response to a force applied to the display that impacts the vibration of the display.

3. The electronic device of example 2, wherein the processor is configured to determine an estimate of a level of the force applied to the display based on the vibration sensor signal.

4. The electronic device of example 3, wherein the processor is configured to adjust the audio signal based on the estimate of the level of the force.

5. The electronic device of example 3, wherein the processor is configured to compare the vibration sensor signal to an expected reference signal and determine the estimate of the level of the force applied to the display based on the comparison.

6. The electronic device of example 3, wherein the processor is configured to increase a magnitude of the audio signal based on the estimate of the level of the force.

7. The electronic device of example 1, wherein the processor is configured to determine changes in a quality factor (Q-factor) of an electromechanical system including the display and the actuator based on the vibration sensor signal, the processor further configured to adjust the audio signal based on the changes in the Q-factor.

8. The electronic device of example 7, wherein the processor is configured to evaluate the vibration sensor signal within a frequency range including a resonant frequency of the electromechanical system where the frequency range is smaller than a voice frequency range of the audio signal, the processor configured to determine the changes in the quality factor based on the evaluation within the frequency range.

9. The electronic device of example 1, wherein the vibration sensor is an accelerometer.

10. The electronic device of example 9, wherein the accelerometer is a wideband accelerometer that has a bandwidth that covers frequencies in a voice frequency range.

11. The electronic device of example 1, further including an audio codec operably coupled to the vibration sensor and configured to output a digital vibration sensor signal to the processor based on the vibration sensor signal provided by the vibration sensor.

12. The electronic device of example 1, wherein the processor is configured to adjust a frequency response of the audio signal provided to the actuator via an audio amplifier based on the vibration sensor signal to provide an adjusted acoustic output from the display.

13. The electronic device of example 1, wherein the vibration sensor signal differs from the audio signal at the input of the actuator based at least in part on a physical dimension or structural characteristic of the display.

14. The electronic device of example 1, further including a second actuator physically coupled to a portion of the electronic device different from where the actuator is physically coupled to the display and configured to cause vibration of the portion in response to a second audio signal provided as an input to the second actuator. The electronic device further includes a second vibration sensor physically coupled to the portion of the electronic device and configured to output a second vibration sensor signal proportional to the vibration of the portion. The processor is configured to adjust the second audio signal based on the second vibration sensor signal.

15. The electronic device of example 1, wherein the processor is configured to convert the vibration sensor signal to a sound pressure level signal, compare the sound pressure level signal to a target sound pressure level model representative of audio output characteristics of the display, and adjust a frequency response of the audio signal based on the comparison.

16. The electronic device of example 1, wherein the processor includes acceleration to sound pressure level signal conversion circuitry operably coupled to an output from the vibration sensor, the acceleration to sound pressure level signal conversion circuitry configured to convert the vibration sensor signal to a sound pressure level signal. The processor further includes sound pressure level signal comparator circuitry operably coupled to the acceleration to sound pressure level signal conversion circuitry, the sound pressure level signal comparator circuitry configured to compare the sound pressure level signal to a target sound pressure level model representative of audio output characteristics of the display and provide an adjusted sound pressure level signal. The processor further includes frequency response correction circuitry operably coupled to the sound pressure level signal comparator circuitry and configured to receive a desired audio signal, the frequency response correction circuitry configured to adjust the audio signal provided to the actuator based on the desired audio signal and the adjusted sound pressure level signal from the sound pressure level signal comparator circuitry, the frequency response correction circuitry configured to provide the audio signal to the actuator via an audio amplifier.

17. The electronic device of example 1, wherein the audio signal is an amplified electrical audio signal generated by an audio amplifier based on an electrical audio signal generated by the processor.

18. An electronic device including a display. The electronic device further includes means for causing vibration of the display based on an audio signal to provide acoustic output from the display due to the vibration of the display. The electronic device further includes means for sensing the vibration of the display, the vibration sensing means configured to output a vibration sensor signal proportional to the vibration of the display due to the vibration causing means. The electronic device further includes means for adjusting the audio signal based on the vibration sensor signal from the vibration sensing means.

19. The electronic device of example 18, wherein the adjusting means is configured to adjust the audio signal in response to a force applied to the display that impacts the vibration of the display.

20. The electronic device of example 19, further including means for determining an estimate of a level of the force applied to the display based on the vibration sensor signal, wherein the adjusting means is configured to adjust the audio signal based on the estimate of the level of the force.

21. A method for producing audio using a display, the method including vibrating the display using an actuator physically coupled to the display based on an audio signal provided as an input to the actuator. The method further includes generating a vibration sensor signal using a vibration sensor physically coupled to the display, the vibration sensor signal proportional to vibration of the display due to the actuator. The method further includes adjusting the audio signal based on the vibration sensor signal from the vibration sensor.

22. The method of example 21, wherein adjusting the audio signal includes adjusting the audio signal in response to a force applied to the display that impacts the vibration of the display by the actuator.

23. The method of example 22, further including determining an estimate of a level of the force applied to the display, by something other than the actuator, based on the vibration sensor signal.

24. The method of example 23, wherein adjusting the audio signal includes adjusting the audio signal based on the estimate of the level of the force.

25. The method of example 23, wherein determining the estimate of the level of the force includes comparing the vibration sensor signal to an expected signal and determining the estimate of the level of the force applied to the display based on the comparison.

26. The method of example 23, wherein adjusting the audio signal includes increasing an intensity level of the audio signal based on the estimate of the level of the force.

27. The method of example 21, further including determining changes in a quality factor (Q-factor) of an electromechanical system including the display and the actuator based on the vibration sensor signal, wherein adjusting the audio signal includes adjusting the audio signal based on the changes in the Q-factor.

28. The method of example 21, wherein the vibration sensor is a wideband accelerometer that has a bandwidth that covers frequencies in a voice frequency range.

29. The method of example 21, wherein adjusting the audio signal includes adjusting a frequency response of the audio signal provided to the actuator based on the vibration sensor signal.

30. The method of example 21, further including converting the vibration sensor signal to a sound pressure level signal and comparing the sound pressure level signal to a target sound pressure level model representative of audio output characteristics of the display and providing an adjusted sound pressure level signal, wherein adjusting the audio signal includes adjusting a frequency response of the audio signal based on the adjusted sound pressure level signal.

31. An electronic device including a display and a first actuator physically coupled to the display and configured to cause vibration of the display in response to a first audio signal provided as an input to the first actuator. The electronic device further includes a vibration sensor physically coupled to the display and configured to output a vibration sensor signal proportional to the vibration of the display due to the first actuator. The electronic device further includes a second actuator physically coupled to a portion of the electronic device different from where the first actuator is physically coupled to the display and configured to cause vibration of the portion in response to a second audio signal provided as an input to the second actuator.

32. The electronic device of example 31, further including a processor configured to generate the first audio signal and the second audio signal.

33. The electronic device of example 32, wherein the processor is configured to generate the second audio signal to have a waveform that causes a cancellation of the vibration of the portion of the electronic device that is caused by the vibration of the display, the display mechanically coupled to the portion of the electronic device.

34. The electronic device of example 33, wherein the second audio signal is generated based in part on the vibration sensor signal from the vibration sensor.

35. The electronic device of example 32, wherein the processor is configured to generate the second audio signal to have a waveform that is out of phase with another signal that is based on the vibration sensor signal of the vibration sensor physically coupled to the display.

36. The electronic device of example 32, wherein the second audio signal provided by the processor to the second actuator is in phase with another signal that is based on the vibration sensor signal of the vibration sensor physically coupled to the display.

37. The electronic device of example 32, wherein the second audio signal provided by the processor to the second actuator has a waveform that aligns vibration of each of the display and the portion of the electronic device with each other.

38. The electronic device of example 31, further including a second vibration sensor physically coupled to the portion of the electronic device and configured to output a second vibration sensor signal proportional to the vibration of the portion.

39. The electronic device of example 38, further including a processor configured to adjust the second audio signal based on the second vibration sensor signal.

40. The electronic device of example 38, further including a processor configured to adjust the second audio signal based on at least one of the vibration sensor signal or the second vibration sensor signal, or a combination thereof.

41. The electronic device of example 40, wherein the processor is configured to generate the second audio signal to have a waveform that causes a cancellation of the vibration of the portion of the electronic device that is caused by the vibration of the display, the display mechanically coupled to the portion of the electronic device.

42. The electronic device of example 31, wherein the portion of the electronic device includes a back or a side panel of the electronic device.

43. The electronic device of example 31, wherein the portion of the electronic device includes a second display.

44. The electronic device of example 31, wherein the vibration sensor is an accelerometer.

45. The electronic device of example 31, wherein the first audio signal is a first amplified electrical audio signal generated by a first audio amplifier based on a first electrical audio signal generated by a processor, wherein the second audio signal is a second amplified electrical audio signal generated by a second audio amplifier based on a second electrical audio signal generated by the processor.

46. The electronic device of example 31, further including a processor configured to: convert the vibration sensor signal to a sound pressure level signal; compare the sound pressure level signal to a first target sound pressure level model representative of audio output characteristics of the display to provide an adjusted sound pressure level signal; adjust a frequency response of the first audio signal based on the adjusted sound pressure level signal; and adjust the second audio signal based on the first audio signal.

47. The electronic device of example 46, wherein the processor is further configured to adjust the second audio signal based on a second target sound pressure level model representative of audio output characteristics of the portion of the electronic device.

48. The electronic device of example 46, further including a second vibration sensor physically coupled to the portion of the electronic device and configured to output a second vibration sensor signal proportional to the vibration of the portion, wherein the processor is further configured to: convert the second vibration sensor signal to a second sound pressure level signal; compare the second sound pressure level signal to a second target sound pressure level model representative of audio output characteristics of the portion of the electronic device to provide a second adjusted sound pressure level signal; and adjust the second audio signal based on the first audio signal and the second adjusted sound pressure level signal.

49. An electronic device including a display and a first means for causing vibration of the display based on a first audio signal to provide acoustic output from the display due to the vibration of the display. The electronic device further including means for sensing the vibration of the display, the vibration sensing means configured to output a vibration sensor signal proportional to the vibration of the display. The electronic device further including a second means for causing vibration of a portion of the electronic device different than the display based on a second audio signal.

50. The electronic device of example 49, further including means for generating the second audio signal to have a waveform that causes a cancellation of the vibration of the portion of the electronic device that is caused by the vibration of the display, the display mechanically coupled to the portion of the electronic device, wherein the second audio signal is generated based in part on the vibration sensor signal from the vibration sensing means.

51. The electronic device of example 49, further including a second means for sensing a vibration of the portion of the electronic device, wherein the second vibration sensing means is configured to output a second vibration sensor signal proportional to the vibration of the portion of the electronic device.

52. A method for producing audio using a display that is part of an electronic device, the method including vibrating the display using a first actuator physically coupled to the display based on a first audio signal provided as an input to the first actuator. The method further includes generating a vibration sensor signal using a vibration sensor physically coupled to the display, the vibration sensor signal proportional to vibration of the display in response to the vibration of the display by the first actuator. The method further includes vibrating a portion of the electronic device different from the display using a second actuator physically coupled to the portion of the electronic device based on a second audio signal provided as an input to the second actuator.

53. The method of example 52, further including generating the second audio signal to have a waveform that causes a cancellation of the vibration of the portion of the electronic device that is caused by the vibration of the display, the display mechanically coupled to the portion of the electronic device.

54. The method of example 53, wherein the second audio signal is generated based in part on the vibration sensor signal from the vibration sensor.

55. The method of example 52, further including generating the second audio signal to have a waveform that is out of phase with a signal that is based on the vibration sensor signal of the vibration sensor physically coupled to the display.

56. The method of example 52, wherein the second audio signal is in phase with another signal that is based on the vibration sensor signal of the vibration sensor.

57. The method of example 52, further including generating a second vibration sensor signal using a second vibration sensor physically coupled to the portion of the electronic device, the second vibration sensor signal proportional to the vibration of the portion.

58. The method of example 57, further including adjusting the second audio signal based on the second vibration sensor signal.

59. The method of example 52, further including converting the vibration sensor signal to a sound pressure level signal, comparing the sound pressure level signal to a first target sound pressure level model representative of audio output characteristics of the display to provide an adjusted sound pressure level signal, adjusting a frequency response of the first audio signal based on the adjusted sound pressure level signal, and adjusting the second audio signal based on the first audio signal.

60. The method of example 59, further including adjusting the second audio signal based on a second target sound pressure level model representative of audio output characteristics of the portion of the electronic device.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general-purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An electronic device comprising:
a display;
an actuator physically coupled to the display and configured to cause vibration of the display in response to an audio signal that is an input to the actuator and that is generated by an audio amplifier;
a vibration sensor physically coupled to the display and separated from the actuator, the vibration sensor configured to sense the vibration of the display due to the actuator and to output a vibration sensor signal proportional to the vibration of the display due to the actuator; and
a processor operably coupled to the vibration sensor, wherein the processor is configured to generate an echo reference signal based on the vibration sensor signal, the echo reference signal representing an acoustic output of the display due to the vibration of the display, wherein the processor is configured to cancel at least part of an echo signal included within a microphone output signal output by a microphone of the electronic device, the processor configured to cancel the at least part of the echo signal based on the echo reference signal generated based on the vibration sensor signal from the vibration sensor.

2. The electronic device of claim 1, further comprising:
the audio amplifier operably coupled to the actuator,
the processor further operably coupled to the audio amplifier; and
the microphone operably coupled to the processor.

3. The electronic device of claim 1, wherein the vibration sensor is an accelerometer.

4. The electronic device of claim 3, wherein the accelerometer is a wideband accelerometer that has a bandwidth that covers frequencies within a voice frequency range.

5. The electronic device of claim 1, further comprising:
an audio codec operably coupled to the vibration sensor and configured to output a digital vibration sensor signal based on the vibration sensor signal,
wherein the processor is operably coupled to the audio codec and configured to generate a sound pressure level signal based on the digital vibration sensor signal.

6. The electronic device of claim 1, wherein the processor is configured to cancel the echo signal further based on the audio signal received from the audio amplifier that is the input to the actuator.

7. The electronic device of claim 1, wherein the echo signal represents an acoustic output of the display due to the vibration of the display that is captured by the microphone.

8. The electronic device of claim 1, wherein the echo reference signal that is based on the vibration sensor signal includes at least one of harmonic distortion caused by the display or group delay.

9. The electronic device of claim 1, wherein the processor is configured to adjust an electrical audio signal provided to the audio amplifier to generate the audio signal, the processor configured to adjust the electrical audio signal based on the vibration sensor signal from the vibration sensor.

10. The electronic device of claim 9, wherein the processor is configured to adjust a frequency response of the electrical audio signal provided to the audio amplifier based on the vibration sensor signal to provide an adjusted acoustic output from the display.

11. The electronic device of claim 9, wherein the processor is configured to:
convert the vibration sensor signal to a sound pressure level signal;
compare the sound pressure level signal to a target sound pressure level model representative of audio output characteristics of the display; and
adjust a frequency response of an electrical audio signal provided to the audio amplifier based on the comparison.

12. The electronic device of claim 1, wherein the vibration sensor signal differs from the audio signal at the input of the actuator based at least on a transfer function representing the vibration of the display in response to the audio signal.

13. The electronic device of claim 1, wherein the vibration sensor signal differs from the audio signal at the input of the actuator based at least in part on a physical dimension or structural characteristic of the display.

14. The electronic device of claim 1, further comprising:
a second actuator physically coupled to a portion of the electronic device different from where the actuator is physically coupled to the display and configured to cause vibration of the portion in response to a second audio signal;
a second vibration sensor physically coupled to the portion of the electronic device and configured to output a second vibration sensor signal proportional to the vibration of the portion.

15. The electronic device of claim 14, wherein the processor is configured to adjust the second audio signal based on at least one of the vibration sensor signal or the second vibration sensor signal, or a combination thereof.

16. The electronic device of claim 1, further comprising:
an array of actuators comprising the actuator, each of the actuators in the array configured to cause vibration of different portions of the electronic device in response to respective audio signals received by the actuators; and
an array of vibration sensors comprising the vibration sensor, each of the vibration sensors in the array configured to output respective vibration sensor signals proportional to the vibration of the different portions of the electronic device.

17. The electronic device of claim 1, wherein the vibration sensor is positioned proximate the actuator.

18. The electronic device of claim 1, wherein the audio signal represents an audio voice signal and wherein the display is configured to provide acoustic output corresponding to the audio voice signal due to the vibration of the display.

19. The electronic device of claim 1, wherein the audio signal is an amplified electrical audio signal generated by the audio amplifier based on an electrical audio signal generated by the processor.

20. An electronic device comprising:
a display;
means for causing vibration of the display based on an audio signal generated by an audio amplifier to provide acoustic output from the display due to the vibration of the display;
means for sensing the vibration of the display, the vibration sensing means configured to output a vibration sensor signal proportional to the vibration of the display in response to the vibration of the display;
means for generating an echo reference signal based on the vibration sensor signal, the echo reference signal representing an acoustic output of the display due to the vibration of the display; and
means for canceling at least part of an echo signal included within a microphone output signal output by a microphone, the cancelling means configured to cancel the at least part of the echo signal based on the echo reference signal generated based on the vibration sensor signal from the vibration sensing means.

21. The electronic device of claim 20, further comprising means for adjusting an electrical audio signal provided to the audio amplifier based on the vibration sensor signal.

22. A method for producing audio using a display, the method comprising:
vibrating the display using an actuator physically coupled to the display based on an audio signal provided as an input to the actuator and generated by an audio amplifier;
generating a vibration sensor signal using a vibration sensor physically coupled to the display and separated from the actuator, the vibration sensor signal proportional to vibration of the display due to the actuator;
generating an echo reference signal based on the vibration sensor signal, the echo reference signal representing an acoustic output of the display due to vibration of the display; and
cancelling at least part of an echo signal included within a microphone output signal output by a microphone, wherein canceling the at least part of the echo signal includes cancelling the at least part of the echo signal based on the echo reference signal generated based on the vibration sensor signal from the vibration sensor.

23. The method of claim 22, wherein the echo signal represents an acoustic output of the display that is captured by the microphone.

24. The method of claim 22, further comprising adjusting an electrical audio signal provided to the audio amplifier based on the vibration sensor signal from the vibration sensor.

25. The method of claim 24, wherein adjusting the electrical audio signal comprises adjusting a frequency response of the electrical audio signal based on the vibration sensor signal from the vibration sensor.

26. The method of claim 22, wherein the vibration sensor is an accelerometer that has a bandwidth that covers frequencies within a voice frequency range.

27. The method of claim 22, further comprising converting the vibration sensor signal to a sound pressure level signal and adjusting the audio signal based on the sound pressure level signal.

28. The method of claim 27, further comprising generating an adjusted sound pressure level signal based on comparing the sound pressure level signal to a target sound pressure level model representative of audio output characteristics of the display, the method comprising adjusting the audio signal based on the adjusted sound pressure level signal.

* * * * *